US008400823B2

(12) United States Patent
Xi et al.

(10) Patent No.: US 8,400,823 B2
(45) Date of Patent: Mar. 19, 2013

(54) MEMORY WITH SEPARATE READ AND WRITE PATHS

(75) Inventors: Haiwen Xi, Prior Lake, MN (US); Hongyue Liu, Maple Grove, MN (US); Michael Xuefei Tang, Bloomington, MN (US); Antoine Khoueir, Apple Valley, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 356 days.

(21) Appl. No.: 12/774,016

(22) Filed: May 5, 2010

(65) Prior Publication Data

US 2010/0208513 A1 Aug. 19, 2010

Related U.S. Application Data

(62) Division of application No. 12/198,416, filed on Aug. 26, 2008, now Pat. No. 7,881,098.

(51) Int. Cl.
*G11C 11/00* (2006.01)

(52) U.S. Cl. ........................................ 365/158; 365/148

(58) Field of Classification Search .................. 365/148, 365/158

See application file for complete search history.

(56) References Cited

U.S. PATENT DOCUMENTS 4,733,371 A 3/1988 Terada
5,191,223 A 3/1993 Munekata
5,646,419 A 7/1997 McCaldin
5,673,225 A 9/1997 Jeong
5,761,115 A 6/1998 Kozicki
5,920,446 A 7/1999 Gill
5,982,670 A 11/1999 Yamashita
6,072,718 A 6/2000 Abraham
6,178,136 B1 1/2001 Lin
6,226,197 B1 5/2001 Nishimura
6,252,796 B1 6/2001 Lenssen
6,381,106 B1 4/2002 Pinarbasi
6,469,926 B1 10/2002 Chen
6,473,275 B1 * 10/2002 Gill .............................. 360/314
6,532,164 B2 3/2003 Redon
6,569,745 B2 5/2003 Hsu (Continued)

FOREIGN PATENT DOCUMENTS

GB 2 422 735 8/2006
WO WO 2008/100868 8/2008

OTHER PUBLICATIONS

Baek et al., Tech. Dig. IEDM (2004) 587.

(Continued)

*Primary Examiner* — Hoai V Ho

(74) *Attorney, Agent, or Firm* — Mueting Raasch & Gebhardt PA

(57) ABSTRACT

A memory unit includes a giant magnetoresistance cell electrically coupled between a write bit line and a write source line. The giant magnetoresistance cell includes a free magnetic layer separated from a first pinned magnetic layer by a first non-magnetic electrically conducting layer. A magnetic tunnel junction data cell is electrically coupled between a read bit line and a read source line. The magnetic tunnel junction data cell includes the free magnetic layer separated from a second pinned magnetic layer by an oxide barrier layer. A write current passes through the giant magnetoresistance cell to switch the giant magnetoresistance cell between a high resistance state and a low resistance state. The magnetic tunnel junction data cell is configured to switch between a high resistance state and a low resistance state by magnetostatic coupling with the giant magnetoresistance cell, and be read by a read current passing though the magnetic tunnel junction data cell.

18 Claims, 12 Drawing Sheets

400
WBL
RBL
420
425
452
430
451
450
435
WWL
414
413
RWL
WSL
RSL

U.S. PATENT DOCUMENTS 6,584,016 B2 6/2003 Park
6,603,677 B2 8/2003 Redon et al.
6,633,498 B1 10/2003 Engel
6,639,830 B1 10/2003 Heide
6,643,168 B2 11/2003 Okazawa
6,700,753 B2 3/2004 Singleton
6,703,645 B2 3/2004 Ohno
6,711,051 B1 3/2004 Poplevine
6,711,067 B1 3/2004 Kablanian
6,714,444 B2 3/2004 Huai
6,741,492 B2 5/2004 Nii
6,744,086 B2 6/2004 Daughton
6,759,263 B2 7/2004 Ying
6,765,819 B1 7/2004 Bhatacharyya
6,774,391 B1 8/2004 Cowburn
6,781,867 B2 8/2004 Kurth
6,781,871 B2 8/2004 Park
6,801,415 B2 10/2004 Slaughter
6,818,961 B1 11/2004 Rizzo
6,829,161 B2 12/2004 Huai
6,831,312 B2 12/2004 Slaughter
6,834,005 B1 12/2004 Parkin
6,835,423 B2 12/2004 Chen
6,838,740 B2 1/2005 Huai
6,842,368 B2 1/2005 Hayakawa
6,845,038 B1 1/2005 Shukh
6,847,547 B2 1/2005 Albert
6,850,433 B2 2/2005 Sharma
6,864,551 B2 3/2005 Tsang
6,888,703 B2 5/2005 Dieny et al.
6,888,742 B1 5/2005 Nguyen
6,909,633 B2 6/2005 Tsang
6,914,807 B2 7/2005 Nakamura
6,920,063 B2 7/2005 Huai
6,930,910 B2 8/2005 Oh
6,933,155 B2 8/2005 Albert
6,943,040 B2 9/2005 Min
6,950,335 B2 9/2005 Dieny
6,958,927 B1 10/2005 Nguyen
6,963,500 B2 11/2005 Tsang
6,965,522 B2 11/2005 Lung
6,967,863 B2 11/2005 Huai
6,979,586 B2 12/2005 Guo
6,985,378 B2 1/2006 Kozicki
6,985,385 B2 1/2006 Nguyen
6,992,359 B2 1/2006 Nguyen
7,009,877 B1 3/2006 Huai
7,020,024 B2 3/2006 Sim
7,057,921 B2 6/2006 Valet
7,067,330 B2 6/2006 Min
7,067,866 B2 6/2006 Shi
7,088,609 B2 8/2006 Valet
7,088,624 B2 8/2006 Daniel
7,092,279 B1 8/2006 Sheppard
7,093,347 B2 8/2006 Nowak
7,098,494 B2 8/2006 Pakala
7,098,495 B2 8/2006 Sun et al.
7,099,186 B1 8/2006 Braun
7,105,372 B2 9/2006 Min
7,110,284 B2 9/2006 Hayakawa
7,110,287 B2 9/2006 Huai
7,126,202 B2 10/2006 Huai
7,138,648 B2 11/2006 Kneissl
7,161,829 B2 1/2007 Huai
7,187,577 B1 3/2007 Wang
7,189,435 B2 3/2007 Tuominen
7,190,611 B2 3/2007 Nguyen
7,196,882 B2 3/2007 Deak
7,224,601 B2 5/2007 Panchula
7,230,265 B2 6/2007 Kaiser
7,230,845 B1 6/2007 Wang
7,233,039 B2 6/2007 Huai
7,241,631 B2 7/2007 Huai
7,241,632 B2 7/2007 Vang
7,242,045 B2 7/2007 Nguyen
7,242,048 B2 7/2007 Huai
7,245,462 B2 7/2007 Huai
7,272,034 B1 9/2007 Chen
7,272,035 B1 9/2007 Chen
7,274,057 B2 9/2007 Worledge
7,282,755 B2 10/2007 Pakala
7,285,836 B2 10/2007 Ju
7,286,395 B2 10/2007 Chen
7,289,356 B2 10/2007 Diao
7,345,912 B2 3/2008 Luo
7,366,009 B2 4/2008 Katti
7,369,427 B2 5/2008 Diao
7,379,327 B2 5/2008 Chen
7,385,842 B2 6/2008 Deak
7,403,418 B2 7/2008 Lin
7,408,806 B2 8/2008 Park
7,411,815 B2 8/2008 Gogl
7,430,135 B2 9/2008 Huai
7,477,491 B2 1/2009 Li
7,480,173 B2 1/2009 Guo
7,485,503 B2 2/2009 Brask
7,486,551 B1 2/2009 Li
7,486,552 B2 2/2009 Apalkov
7,489,541 B2 2/2009 Pakala
7,495,867 B2 2/2009 Sbiaa
7,502,249 B1 3/2009 Ding
7,515,457 B2 4/2009 Chen
7,518,835 B2 4/2009 Huai
7,539,047 B2 5/2009 Katti
7,572,645 B2 8/2009 Sun
7,573,736 B2 8/2009 Wang
7,576,956 B2 8/2009 Huai
7,728,622 B2 6/2010 Chua-Eoan et al.
7,764,537 B2 7/2010 Jung
2003/0011945 A1 1/2003 Yuasa
2003/0137864 A1 7/2003 Holden
2004/0008537 A1 1/2004 Sharma
2004/0084702 A1 5/2004 Jeong
2004/0090809 A1 5/2004 Tran
2004/0170055 A1 9/2004 Albert
2004/0179311 A1 9/2004 Li
2004/0197579 A1 10/2004 Chen
2005/0048674 A1 3/2005 Shi
2005/0068684 A1 3/2005 Gill
2005/0117391 A1 6/2005 Yoda
2005/0139883 A1 6/2005 Sharma
2005/0150535 A1 7/2005 Samavedam
2005/0150537 A1 7/2005 Ghoshal
2005/0184839 A1 8/2005 Nguyen
2005/0185459 A1 8/2005 Fukuzumi
2005/0237787 A1 10/2005 Huai
2005/0254286 A1 11/2005 Valet
2005/0269612 A1 12/2005 Torok
2005/0275003 A1 12/2005 Shinmura
2005/0282379 A1 12/2005 Saito
2006/0049472 A1 3/2006 Diao
2006/0060832 A1 3/2006 Symanczyk
2006/0061919 A1 3/2006 Li
2006/0083047 A1 4/2006 Fujita
2006/0141640 A1 6/2006 Huai
2006/0171199 A1 8/2006 Ju
2006/0233017 A1 10/2006 Hosotani
2006/0245117 A1 11/2006 Nowak
2007/0002504 A1 1/2007 Huai
2007/0007609 A1 1/2007 Saito
2007/0008661 A1 1/2007 Min
2007/0025164 A1 2/2007 Kim
2007/0029630 A1 2/2007 Seyyedy
2007/0035890 A1 2/2007 Sbiaa
2007/0047294 A1 3/2007 Panchula
2007/0054450 A1 3/2007 Hong
2007/0063237 A1 3/2007 Huai
2007/0064352 A1 3/2007 Gill
2007/0069314 A1 3/2007 Wilson
2007/0085068 A1 4/2007 Apalkov
2007/0096229 A1 5/2007 Yoshikawa
2007/0120210 A1 5/2007 Yuan
2007/0132049 A1 6/2007 Stipe
2007/0164380 A1 7/2007 Min
2007/0171694 A1 7/2007 Huai
2007/0230233 A1 10/2007 Takahashi
2007/0241392 A1 10/2007 Lin

| | | | | |
|---|---|---|---|---|
| 2007/0246787 | A1 | 10/2007 | Wang | |
| 2007/0279968 | A1 | 12/2007 | Luo | |
| 2007/0297220 | A1 | 12/2007 | Yoshikawa | |
| 2007/0297223 | A1 | 12/2007 | Chen | |
| 2008/0026253 | A1 | 1/2008 | Yuasa | |
| 2008/0061388 | A1 | 3/2008 | Diao | |
| 2008/0130354 | A1 | 6/2008 | Ho | |
| 2008/0179699 | A1 | 7/2008 | Horng | |
| 2008/0180991 | A1 | 7/2008 | Wang | |
| 2008/0191251 | A1 | 8/2008 | Ranjan | |
| 2008/0205121 | A1 | 8/2008 | Chen | |
| 2008/0258247 | A1 | 10/2008 | Mancoff | |
| 2008/0265347 | A1 | 10/2008 | Iwayama | |
| 2008/0273380 | A1 | 11/2008 | Diao | |
| 2008/0277703 | A1 | 11/2008 | Iwayama | |
| 2008/0291721 | A1 | 11/2008 | Apalkov | |
| 2008/0310213 | A1 | 12/2008 | Chen | |
| 2008/0310219 | A1 | 12/2008 | Chen | |
| 2009/0027810 | A1 | 1/2009 | Horng | |
| 2009/0040855 | A1 | 2/2009 | Luo | |
| 2009/0050991 | A1 | 2/2009 | Nagai | |
| 2009/0073756 | A1 | 3/2009 | Yang | |
| 2009/0185410 | A1 | 7/2009 | Huai | |
| 2009/0218645 | A1 | 9/2009 | Ranjan | |
| 2009/0246557 | A1* | 10/2009 | Horng et al. | 428/811.1 |
| 2009/0257154 | A1 | 10/2009 | Carey | |
| 2009/0296454 | A1 | 12/2009 | Honda | |
| 2009/0302403 | A1 | 12/2009 | Nguyen | |
| 2010/0034009 | A1 | 2/2010 | Lu | |
| 2010/0118600 | A1 | 5/2010 | Nagasi | |
| 2010/0176471 | A1 | 7/2010 | Zhu | |

OTHER PUBLICATIONS

Berger, Emission of Spin Waves by Magnetic Mutilayer Traversed by a Current, Physic. Review B 54, 9353 (1996).
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15, 1997.
Emley, N.C., et al., Reduction of Spin Transfer by Synthetic Antiferromagnets, Applied Physics Letters, May 27, 2004, pp. 4257-4259, vol. 84, No. 21.
Folk et al., A Gate-Controlled Bidirectional Spin Filter Using Quantum Coherence, Science, vol. 229, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-1060.
Huckzo, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Road, ISSCC 2007, Section 26, Non-Volatile Memories/26. 5.
Korenivski, et al., Thermally Activated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15, 2003.
Macak et al., High-Aspecy-Ratio TiO2, Nanotubes by Anodization of Titanium, Angew. Chem. Int. Ed. 2005, 44, 2100-2102.
Masuda and Kenji Fukuda, Science, 268, 1466 91995).
Masuda et al., Ordered Metal Nanohole Arrays Made by Two-Step Replication of Honeycomb Structures of Anodic Alumina, Science, OI. 268, Jun. 9, 1995.
Meng et al., A Spintronics Full Adder for Magnetic CPU, IEEE Elec. Dev. Lett. 26, 360 (2005).
Meng et al., Spin Transfer in Nanomagnetic Devices with Perpendicular Anistropy, Applied Physics Letters 88, 172506 (2006).
Miura et al., A Novel SPRAM (Spin Transfer Torque RAM) with a Synthetic Ferrimagnetic Free Layer . . . , VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Oct. 4, 2010.
PCT Search Report and Written Opinion dated Mar. 10, 2010.
PCT Search Report and Written Opinion dated Mar. 22, 2010.
Prejbeanu et al., Thermally Assisted MRAM, J. Phys. Condens. Matter 19 (2007) 165218 (23 pp).
Seki et al., Spin-Polarized Current-Induced Magnetization Reversal in Perpendicularly Magnetized L1o-FePt Layers, Applied Physics Letters 88, 172504 (2006).
Sharrock, Time Dependence of Switching Fields in Magnetic Recording Media (Invited), J. Appl. Phys. 76 (10), Nov. 15, 1994.
Slonczewski et al., Current-Driven Excitation of Magnetic Multilayers, Journal of Magnetism and Magnetic Materials 159 (1996) L1-L7.
Sun, "Spin-Current Interaction with a Monodomain Magnetic Body: A Model Study", Physical Review B, vol. 62, No. 1, (2000), pp. 570-578.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/416,976, filed Apr. 2, 2009, Inventor: Zheng.
U.S. Appl. No. 12/106,382, filed Apr. 21, 2008, Inventors: Xi et al.
U.S. Appl. No. 12/125,975, filed May 23, 2008, Inventor: Xi.
U.S. Appl. No. 12/126,014, filed May 23, 2008, Inventor: Xiaohua Lou.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,882, filed Sep. 29, 2008, Inventor: Zheng et al.
U.S. Appl. No. 12/239,887, filed Sep. 29, 2008, Inventor: Zheng.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/269,537, filed Nov. 12, 2008, Inventor: Tang et al.
U.S. Appl. No. 12/396,905, filed Mar. 3, 2009, Inventor: Gao.
U.S. Appl. No. 12/398,214, filed Mar. 5, 2009, Inventor: Wang et al.
U.S. Appl. No. 12/425,457, filed Apr. 17, 2009, Inventor: Gao.
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin SiO2 Films Grown on Mo(112), 2005, Phys. Rev. vol. B72, pp. 1150409-1-115409.0.
Yan et al., Magnesium Oxide as a Candidate High-k Gate Dielelectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Low Switching Current Flux-Closed Magnetoresistive Random Access Memory, Journal of Applied Physics, May 15, 2003.
Zheng et al., Magnetic Random Access Memory (MRAM), Journal of Nanoscience and Nanotechnology, vol. 7, 117-137 (2007).
Zhuang et al., Tech Dig. IEDM (2002) 193.
Su, J.Z., Spin Angular Momentum Transfer in Current-Perpendicular Nanomagnetic Junctions, IBM J. Res & Dev., vol. 50, No. 1, Jan. 2006, pp. 81-100.
R. P. Cowburn et al., Room Temperature Magnetic Quantum Cellular Automata, Science 287, 1466 (2000).

* cited by examiner

MEMORY WITH SEPARATE READ AND WRITE PATHS

CROSS-REFERENCE

This application is a divisional of application Ser. No. 12/198,416, filed Aug. 26, 2008, the contents of each is hereby incorporated by reference in its entirety.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is a promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One challenge is that the barrier layer of the MTJ needs to be thick enough to accurately read the MTJ but thin enough to pass enough current to write to the MTJ without damaging the barrier layer. Thus there is a tradeoff in read verses write performance based on the particular barrier thickness.

BRIEF SUMMARY

The present disclosure relates to spin-transfer torque memory. In particular, the present disclosure relates to memory that includes a separate read and write path. A write current sets the magnetization orientation of a giant magnetoresistance (GMR) cell free layer. A free layer magnetization orientation of an adjacent magnetic tunnel junction data (MTJ) cell is then set by magnetostatic coupling, for example, with the magnetization orientation of a giant magnetoresistance (GMR) cell free layer. The resistance or data state of the memory unit can then be read out by passing a read current through the magnetic tunnel junction data cell.

One illustrative memory unit includes a giant magnetoresistance cell electrically coupled between a write bit line and a write source line. The giant magnetoresistance cell includes a free magnetic layer separated from a first pinned magnetic layer by a first non-magnetic electrically conducting layer. A magnetic tunnel junction data cell is electrically coupled between a read bit line and a read source line. The magnetic tunnel junction data cell includes the free magnetic layer separated from a second pinned magnetic layer by an oxide barrier layer. A write current passes through the giant magnetoresistance cell to switch the giant magnetoresistance cell between a high resistance state and a low resistance state. The magnetic tunnel junction data cell is configured to switch between a high resistance state and a low resistance state by magnetostatic coupling with the giant magnetoresistance cell, and be read by a read current passing though the magnetic tunnel junction data cell.

Another illustrative memory unit includes a giant magnetoresistance cell electrically coupled between a write bit line and a write source line. A write current passing through the giant magnetoresistance cell switches the giant magnetoresistance cell between a high resistance state and a low resistance state. The giant magnetoresistance cell includes a free magnetic layer separated from a pinned magnetic layer by a non-magnetic electrically conducting layer. A magnetic tunnel junction data cell is electrically coupled between a read bit line and a read source line. The magnetic tunnel junction data cell is configured to switch between a high resistance state and a low resistance state, and be read by a read current passing though the magnetic tunnel junction data cell. The magnetic tunnel junction data cell includes a free magnetic layer separated from a pinned magnetic layer by an oxide barrier layer. The free magnetic layer of the magnetic tunnel junction data cell is coextensive with the free magnetic layer of the giant magnetoresistance cell.

An illustrative method includes passing a write current thorough a giant magnetoresistance cell to switch a free magnetic layer between a high resistance state and a low resistance state. The free layer is common to both the giant magnetoresistance cell and a magnetic tunnel junction data cell. Then the method includes reading the resistance state of the magnetic tunnel junction data cell by passing a reading current through the magnetic tunnel junction data cell.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin-transfer torque memory. In particular, the present disclosure relates to memory that includes a separate read and write path. A write current sets the magnetization orientation of a giant magnetoresistance (GMR) cell free layer while isolating the write current path to the GMR cell (by for example, floating the MTJ cell during the write operation). A free layer magnetization orientation of an adjacent magnetic tunnel junction data (MTJ) cell is then set by magnetostatic coupling with the magnetization orientation of a giant magnetoresistance (GMR) cell free layer. The resistance or data state of the memory unit can then be read out by passing a read current through the magnetic tunnel junction data cell. Isolating the writing current path to the GMR cell and isolating the read current path to the MTJ cell (by for example, floating the GMR cell during the read operation). This allows each cell to be tailored to the specific read or write conditions and thus improve performance of each cell and the memory unit. While the present disclosure is not so limited, an appreciation of various aspects of the disclosure will be gained through a discussion of the examples provided below.

Figure 1:
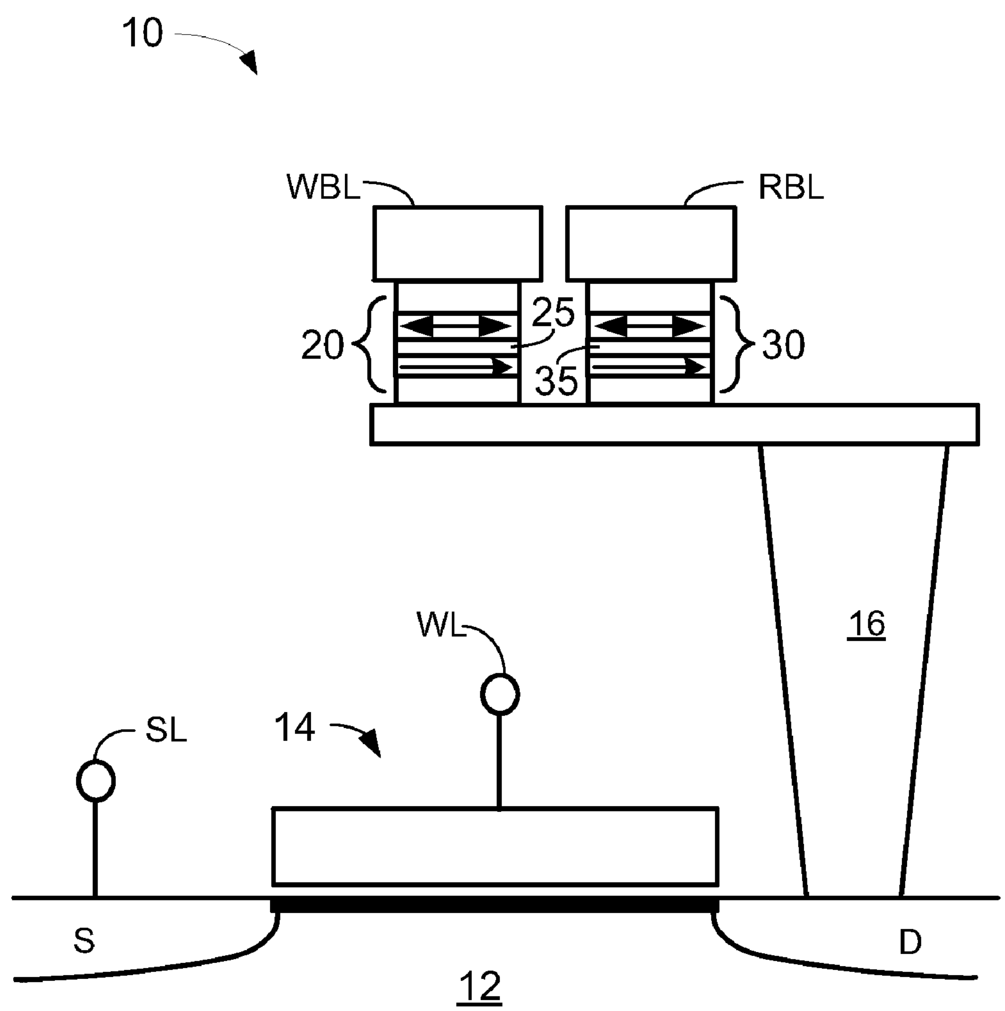
FIG. 1 is a cross-sectional schematic diagram of an illustrative memory unit.

FIG. 1 is a cross-sectional schematic diagram of an illustrative memory unit 10. The memory unit includes a giant magnetoresistance cell 20 electrically coupled between a write bit line WBL and a write source line SL. A magnetic tunnel junction data cell 30 is electrically coupled between a read bit line RBL and a read source line SL. In the illustrated embodiment, the write source line SL and the read source line SL is a common source line SL and the write source line SL and the read source line SL are not separately addressable.

The giant magnetoresistance cell 20 and the magnetic tunnel junction data cell 30 can be isolated from each other and adjacent each (sufficiently close to each other) other to allow for magnetostatic coupling (i.e., magnetic dipolar interaction) between the giant magnetoresistance cell 20 and the magnetic tunnel junction data cell 30. The coupling strength is inversely proportional to the separation of the elements. Thus, in many embodiments, it is desirable to have the giant magnetoresistance cell 20 and the magnetic tunnel junction data cell 30 as close as possible, for example in a range from 20 to 100 nm.

A transistor 14 is electrically couples the source line SL to both the giant magnetoresistance cell 20 and the magnetic tunnel junction data cell 30. The transistor 14 has a gate that is electrically coupled to a word line WL to activate the transistor 14 and allow current to pass between the source line SL and the write bit line WBL and/or read bit line RBL. The transistor 14 can be any useful transistor such as, for example, a PMOS or NMOS semiconductor device. The illustrated semiconductor transistor device is formed on a substrate 12 and includes a doped source region S and a doped drain region D. In some embodiments (as illustrated), an electrically conductive plug element 16 electrically connects the transistor 14 with both the giant magnetoresistance cell 20 and the magnetic tunnel junction data cell 30. To avoid current sneak paths, a diode may be included between the giant magnetoresistance cell 20 and the write bit line WBL or between the magnetic tunnel junction data cell 30 and the read bit line RBL, as desired.

The giant magnetoresistance cell 20 includes a ferromagnetic free layer (double headed arrow layer) and a ferromagnetic reference (i.e., pinned) layer (single headed arrow layer). The ferromagnetic free layer and a ferromagnetic reference layer are separated by a non-magnetic electrically conducting layer 25. The ferromagnetic layers (free and pinned layers) may be made of any useful ferromagnetic (FM) alloys such as, for example, Fe, Co, Ni and the non-magnetic electrically conducting layer 25 may be made of any non-magnetic electrically conducting such as, for example a non-magnetic metal (e.g., Cu, Ru, Au or Ag). Other suitable materials may also be used.

The write current passes through the giant magnetoresistance cell 20 and alters the relative orientation of the magnetization vectors or magnetization orientations of the ferromagnetic layers (free and pinned layers). The giant magnetoresistance cell 20 is in the low resistance state where the magnetization orientation of the ferromagnetic free layer is parallel and in the same direction of the magnetization orientation of the ferromagnetic reference or pinned layer. The giant magnetoresistance cell 20 is in the high resistance state where the magnetization orientation of the ferromagnetic free layer is anti-parallel and in the opposite direction of the magnetization orientation of the ferromagnetic reference or pinned layer. For example, sufficient current flowing in a first direction through the giant magnetoresistance cell 20 places the giant magnetoresistance cell 20 in a low resistance state and sufficient current flowing in a second direction (opposing the first direction) through the giant magnetoresistance cell 20 places the giant magnetoresistance cell 20 in a high resistance state.

The magnetic tunnel junction data cell 30 includes a ferromagnetic free layer (double headed arrow layer) and a ferromagnetic reference (i.e., pinned) layer (single headed arrow layer). The ferromagnetic free layer and a ferromagnetic reference layer are separated by an oxide barrier layer 35 or tunnel barrier. The ferromagnetic layers (free and pinned layers) may be made of any useful ferromagnetic (FM) alloys such as, for example, Fe, Co, Ni and the insulating barrier layer 35 may be made of any electrically insulating material such as, for example an oxide material (e.g., $Al_2O_3$ or MgO). Other suitable materials may also be used.

The read current resistance across the magnetic tunnel junction data cell 30 is determined by the relative orientation of the magnetization vectors or magnetization orientations of the ferromagnetic layers (free and pinned layers). The magnetic tunnel junction data cell 30 is in the low resistance state where the magnetization orientation of the ferromagnetic free layer is parallel and in the same direction of the magnetization orientation of the ferromagnetic reference or pinned layer. This is termed the low resistance state or "0" data state. The magnetic tunnel junction data cell 30 is in the high resistance state where the magnetization orientation of the ferromagnetic free layer is anti-parallel and in the opposite direction of the magnetization orientation of the ferromagnetic reference or pinned layer. This is termed the high resistance state or "1" data state.

The magnetization direction of the ferromagnetic reference layer is pinned in a predetermined direction while the magnetization direction of the ferromagnetic free layer is free to rotate under the influence of magnetostatic coupling with the free layer of the giant magnetoresistance cell 20. The magnetic tunnel junction data cell 30 is configured to switch between a high resistance state and a low resistance state by magnetostatic coupling with the giant magnetoresistance cell. Pinning of the ferromagnetic reference layer may be achieved through, e.g., the use of exchange bias with an antiferromagnetically ordered material such as PtMn, IrMn and others.

An alternate method of switching the resistance state (not utilized here) and hence the data state of the magnetic tunnel junction data cell is via spin-transfer occurs when a current, passing through a magnetic layer of the magnetic tunnel junction data cell, becomes spin polarized and imparts a spin torque on the free layer of the magnetic tunnel junction data cell. When a sufficient spin torque is applied to the free layer, the magnetization orientation of the free layer can be switched between two opposite directions and accordingly the magnetic tunnel junction data cell can be switched between the parallel state (i.e., low resistance state or "0" data state) and anti-parallel state (i.e., high resistance state or "1" data state) depending on the direction of the current. However, in some instances the oxide barrier can be degraded with the large write current density utilized to switch the magnetic tunnel junction data cell. Thus, the present disclosure eliminates passing the write through the magnetic tunnel junction data cell and thus the magnetic tunnel junction data cell can be tailored to maximize the reading operation on the magnetic tunnel junction data cell.

The illustrative memory unit 10 may be used to construct a memory device that includes multiple memory units (see FIG. 2) where a data bit is stored in magnetic tunnel junction data cell by changing the relative magnetization state of the free magnetic layer with respect to the pinned magnetic layer by magnetostatic coupling with the free layer of the giant magnetoresistance cell. The stored data bit can be read out by measuring the resistance of the magnetic tunnel junction data cell. In order for the memory unit 10 to have the characteristics of a non-volatile memory, the free layers of the MTJ and GMR exhibit thermal stability against random fluctuations so that the orientation of the free layers are changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 2:
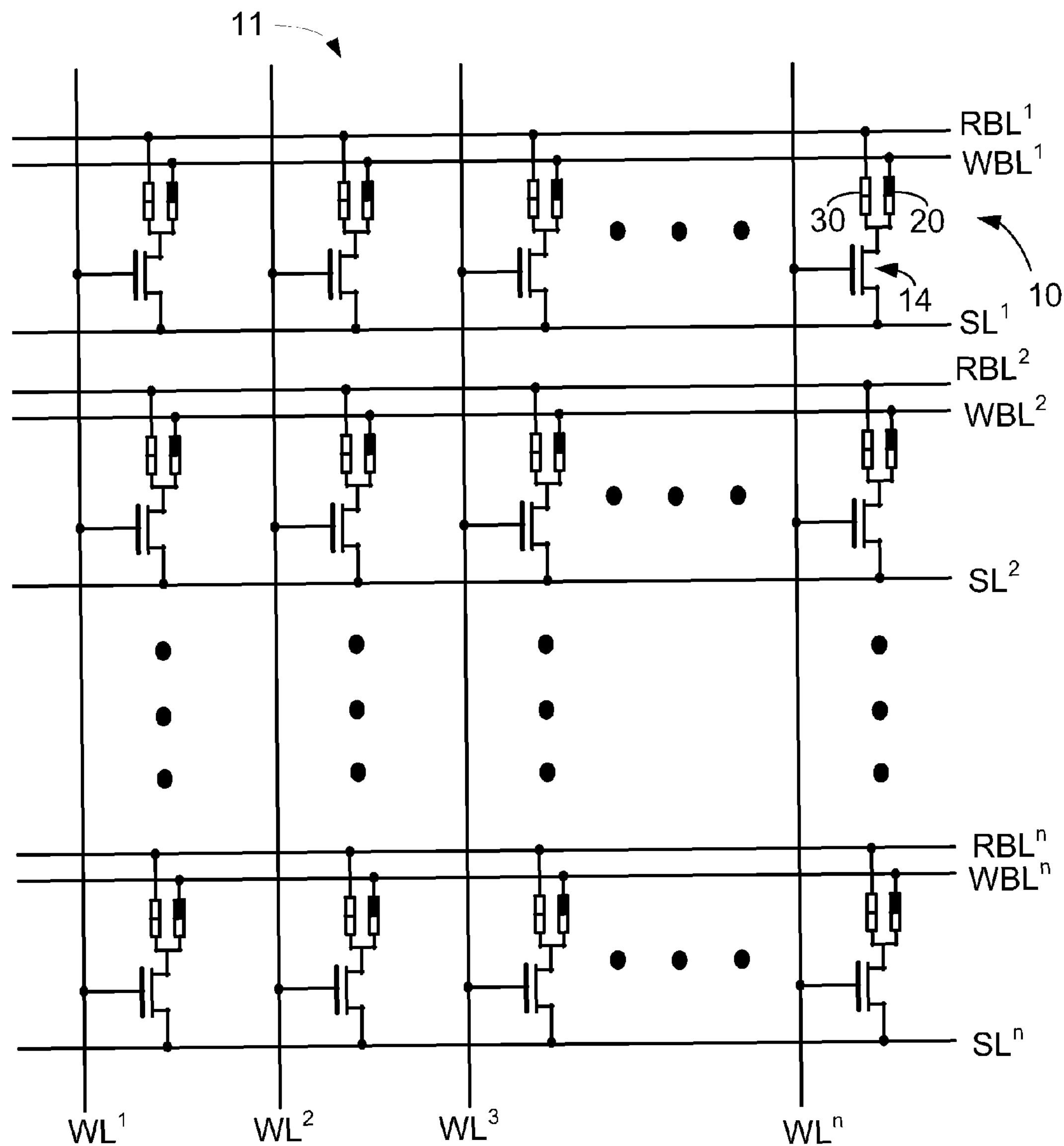
FIG. 2 is a schematic circuit diagram of an illustrative array of the memory units of FIG. 1.

FIG. 2 is a schematic circuit diagram of an illustrative array 11 of the memory units 10 of FIG. 1. The memory array 11 includes a plurality of memory units 10 described above and configured and arranged in a cross-point array where each cross-point includes a read bit line $RBL^1$ $RBL^2$ $RBL''$, a write bit line $WBL^1$ $WBL^2$ $WBL''$, a source line $SL^1$ $SL^2$ $SL''$ and a word line $WL^1$ $WL^2$ $WL^3$ $WL''$. For example, the labeled cross point memory unit 10 is electrically coupled to the $SL^1$ via the transistor 14. The transistor 14 is electrically coupled to the $WL''$. The giant magnetoresistance cell 20 is electrically coupled to the write bit line $WBL^1$ and the magnetic tunnel junction data cell 30 is electrically coupled to the read bit line $RBL^1$.

Figure 3:
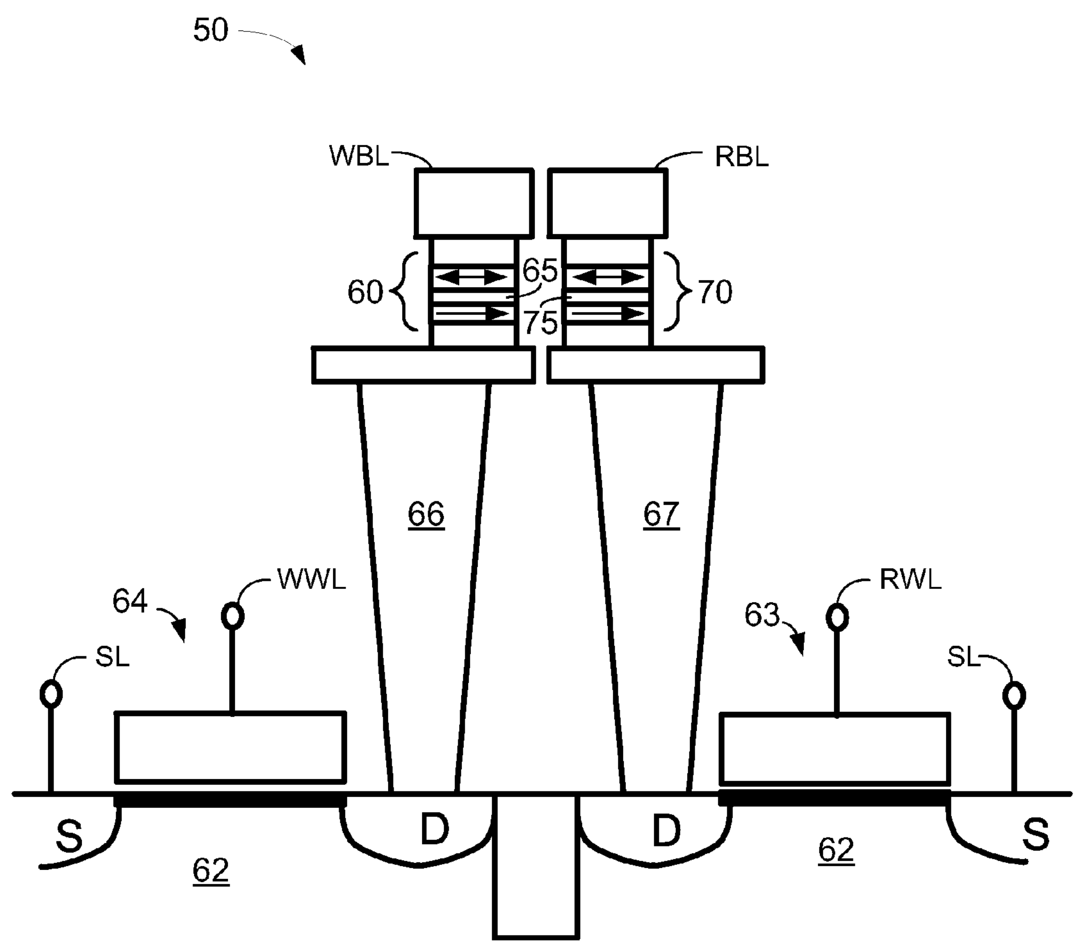
FIG. 3 is a cross-sectional schematic diagram of another illustrative memory unit.

FIG. 3 is a cross-sectional schematic diagram of another illustrative memory unit 50. The memory unit includes a giant magnetoresistance cell 60 electrically coupled between a write bit line WBL and a write source line SL. A magnetic tunnel junction data cell 70 is electrically coupled between a read bit line RBL and a read source line SL. In the illustrated embodiment, the write source line SL and the read source line SL is a common source line SL and the write source line SL and the read source line SL are not separately addressable.

The giant magnetoresistance cell 60 and the magnetic tunnel junction data cell 70 can isolated from each other and adjacent each (sufficiently close to each other) other to allow for magnetostatic coupling (i.e., magnetic dipolar interaction) between the giant magnetoresistance cell 60 and the magnetic tunnel junction data cell 70, as described above.

A write transistor 64 is electrically couples the source line SL to giant magnetoresistance cell 60. The write transistor 64 has a gate that is electrically coupled to a write word line WWL to activate the write transistor 64 and allow current to pass between the source line SL and the write bit line WBL. The write transistor 64 can be any useful transistor, as described above. The illustrated semiconductor transistor device 64 is formed on a substrate 62 and includes a doped source region S and a doped drain region D. In some embodiments (as illustrated), an electrically conductive plug element 66 electrically connects the write transistor 64 with the giant magnetoresistance cell 60.

A read transistor 63 electrically couples the source line SL to the magnetic tunnel junction data cell 70. The read transistor 63 has a gate that is electrically coupled to a read word line RWL to activate the read transistor 63 and allow current to pass between the source line SL and the read bit line RBL. The read transistor 63 can be any useful transistor, as described above. The illustrated semiconductor transistor device 63 is formed on a substrate 62 and includes a doped source region S and a doped drain region D. In some embodiments (as illustrated), an electrically conductive plug element 67 electrically connects the read transistor 63 with the magnetic tunnel junction data cell 70.

The giant magnetoresistance cell 60 includes a ferromagnetic free layer (double headed arrow layer) and a ferromagnetic reference (i.e., pinned) layer (single headed arrow layer). The ferromagnetic free layer and a ferromagnetic reference layer are separated by a non-magnetic electrically conducting layer 65, as described above. The magnetic tunnel junction data cell 70 includes a ferromagnetic free layer (double headed arrow layer) and a ferromagnetic reference (i.e., pinned) layer (single headed arrow layer). The ferromagnetic free layer and a ferromagnetic reference layer are separated by an oxide barrier layer 75 or tunnel barrier, as described above.

The write current passes through the giant magnetoresistance cell 60 and alters the relative orientation of the magnetization vectors or magnetization orientations of the ferromagnetic layers (free and pinned layers), as described above. The read current resistance across the magnetic tunnel junction data cell 70 is determined by the relative orientation of the magnetization vectors or magnetization orientations of the ferromagnetic layers (free and pinned layers), as described above.

The magnetization direction of the ferromagnetic reference layer is pinned in a predetermined direction while the magnetization direction of the ferromagnetic free layer is free to rotate under the influence of magnetostatic coupling with the free layer of the giant magnetoresistance cell 60. The magnetic tunnel junction data cell 70 is configured to switch between a high resistance state and a low resistance state by magnetostatic coupling with the giant magnetoresistance cell. Pinning of the ferromagnetic reference layer may be achieved through, e.g., the use of exchange bias with an antiferromagnetically ordered material such as PtMn, IrMn and others.

The illustrative memory unit 50 may be used to construct a memory device that includes multiple memory units (see FIG. 4) where a data bit is stored in magnetic tunnel junction data cell by changing the relative magnetization state of the free magnetic layer with respect to the pinned magnetic layer by magnetostatic coupling with the free layer of the giant magnetoresistance cell. The stored data bit can be read out by measuring the resistance of the magnetic tunnel junction data cell. In order for the memory unit 50 to have the characteristics of a non-volatile memory, the free layers of the MTJ and GMR exhibit thermal stability against random fluctuations so that the orientation of the free layers are changed only when it is controlled to make such a change, as described above.

Figure 4:
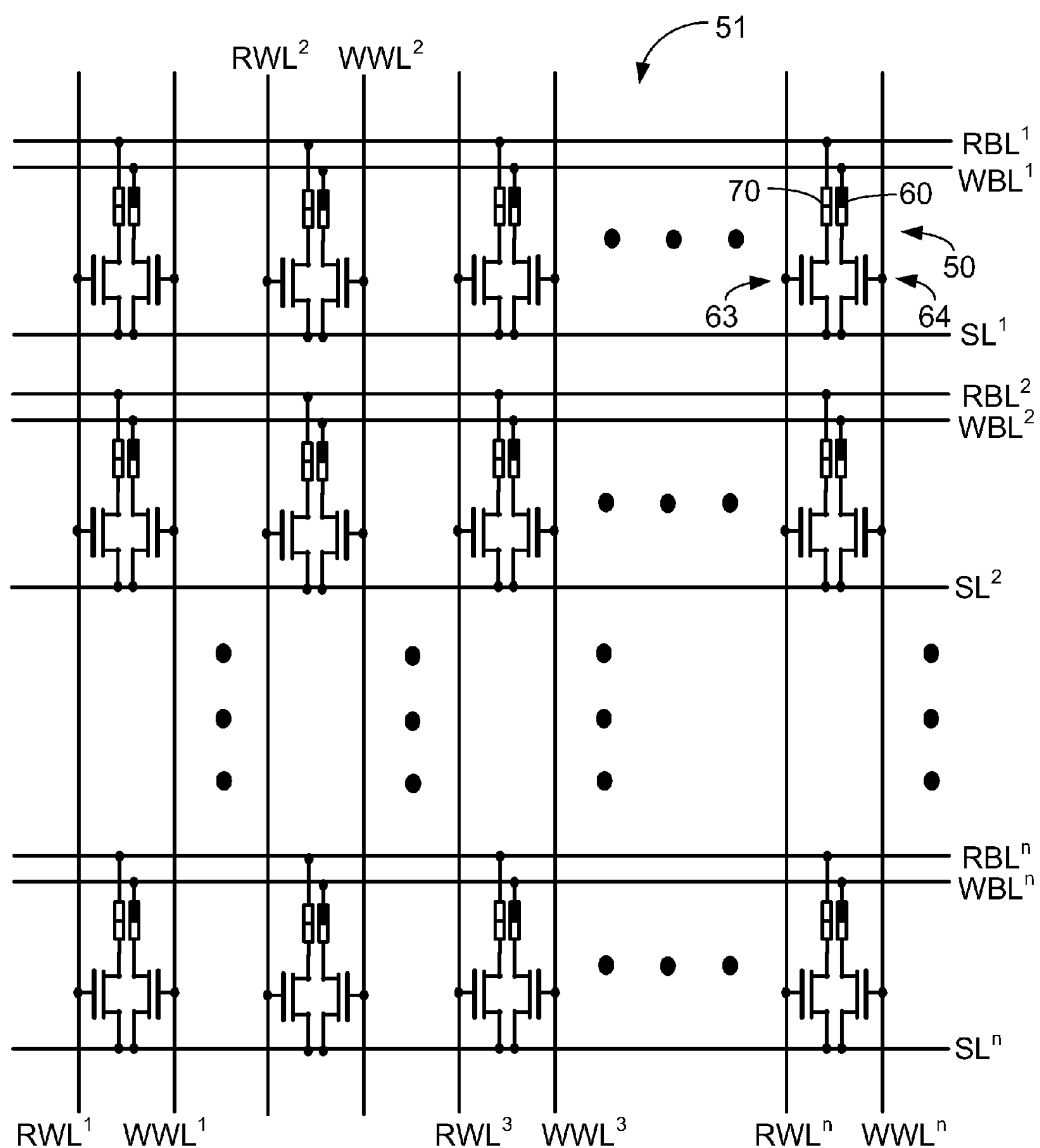
FIG. 4 is a schematic circuit diagram of an illustrative array of the memory units of FIG. 3.

FIG. 4 is a schematic circuit diagram of an illustrative array 51 of the memory units 50 of FIG. 3. The memory array 51 includes a plurality of memory units 50 described above and configured and arranged in a cross-point array where each cross-point includes a read bit line $RBL^1$ $RBL^2$ $RBL''$, a write bit line $WBL^1$ $WBL^2$ $WBL''$, a source line $SL^1$ $SL^2$ $SL''$, a write word line $WWL^1$ $WWL^2$ $WWL^3$ $WWL''$ and a read word line $RWL^1$ $RWL^2$ $RWL^3$ $RWL''$. For example, the labeled cross point memory unit 50 is electrically coupled to the $SL^1$ via the write transistor 64 and the read transistor 63. The write transistor 64 is electrically coupled to the $WWL''$ and the read transistor 63 is electrically coupled to the $RWL''$. The giant magnetoresistance cell 60 is electrically coupled to the write bit line $WBL^1$ and the write transistor 64. The magnetic tunnel junction data cell 70 is electrically coupled to the read bit line $RBL^1$ and the read transistor 63.

Figure 5:
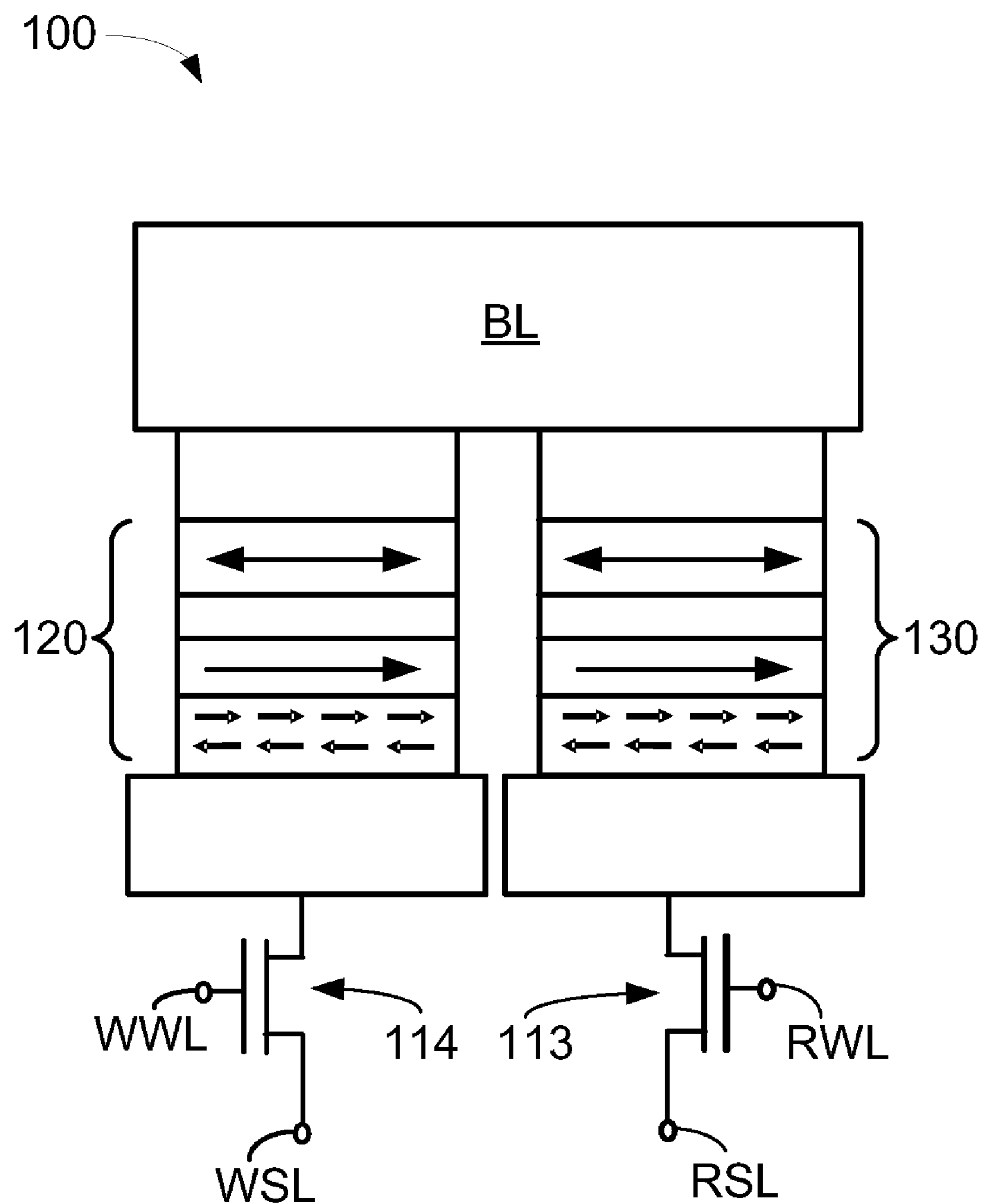
FIG. 5 is a cross-sectional schematic diagram of another illustrative memory unit.

FIG. 5 is a cross-sectional schematic diagram of another illustrative memory unit 100. The memory unit 100 includes a giant magnetoresistance cell 120 electrically coupled between a write bit line BL and a write source line WSL. A magnetic tunnel junction data cell 130 is electrically coupled between a read bit line BL and a read source line RSL. In the illustrated embodiment, the write bit line BL and the read bit line BL is a common bit line BL (or common electrode) and the write bit line BL and the read bit line BL are not separately addressable.

The giant magnetoresistance cell 120 and the magnetic tunnel junction data cell 130 can isolated from each other and adjacent each (sufficiently close to each other) other to allow for magnetostatic coupling (i.e., magnetic dipolar interaction) between the giant magnetoresistance cell 120 and the magnetic tunnel junction data cell 130, as described above.

A write transistor 114 is electrically couples a write source line WSL to the giant magnetoresistance cell 120. The write transistor 114 has a gate that is electrically coupled to a write word line WWL to activate the write transistor 114 and allow current to pass between the write source line WSL and the write bit line BL. The write transistor 114 can be any useful transistor, as described above.

A read transistor 113 electrically couples the read source line RSL to the magnetic tunnel junction data cell 130. The read transistor 113 has a gate that is electrically coupled to a read word line RWL to activate the read transistor 113 and allow current to pass between the read source line RSL and the read bit line BL. The read transistor 113 can be any useful transistor, as described above.

The giant magnetoresistance cell 120 and the magnetic tunnel junction data cell 130 are described above. In the illustrated embodiment, a pinning layer (multiple small single headed arrow layer) can be present to assist in pinning the pinned layer. The write current passes through the giant magnetoresistance cell 120 and alters the relative orientation of the magnetization vectors or magnetization orientations of the ferromagnetic layers (free and pinned layers), as described above. The read current resistance across the magnetic tunnel junction data cell 130 is determined by the relative orientation of the magnetization vectors or magnetization orientations of the ferromagnetic layers (free and pinned layers), as described above.

The magnetization direction of the ferromagnetic reference layer is pinned in a predetermined direction while the magnetization direction of the ferromagnetic free layer is free to rotate under the influence of magnetostatic coupling with the free layer of the giant magnetoresistance cell 120. The magnetic tunnel junction data cell 130 is configured to switch between a high resistance state and a low resistance state by magnetostatic coupling with the giant magnetoresistance cell. Pinning of the ferromagnetic reference layer may be achieved through, e.g., the use of exchange bias with an antiferromagnetically ordered material such as PtMn, IrMn and others.

The illustrative memory unit 100 may be used to construct a memory device that includes multiple memory units (see FIG. 6) where a data bit is stored in magnetic tunnel junction data cell by changing the relative magnetization state of the free magnetic layer with respect to the pinned magnetic layer by magnetostatic coupling with the free layer of the giant magnetoresistance cell. The stored data bit can be read out by measuring the resistance of the magnetic tunnel junction data cell. In order for the memory unit 100 to have the characteristics of a non-volatile memory, the free layers of the MTJ and GMR exhibit thermal stability against random fluctuations so that the orientation of the free layers are changed only when it is controlled to make such a change, as described above.

Figure 6:
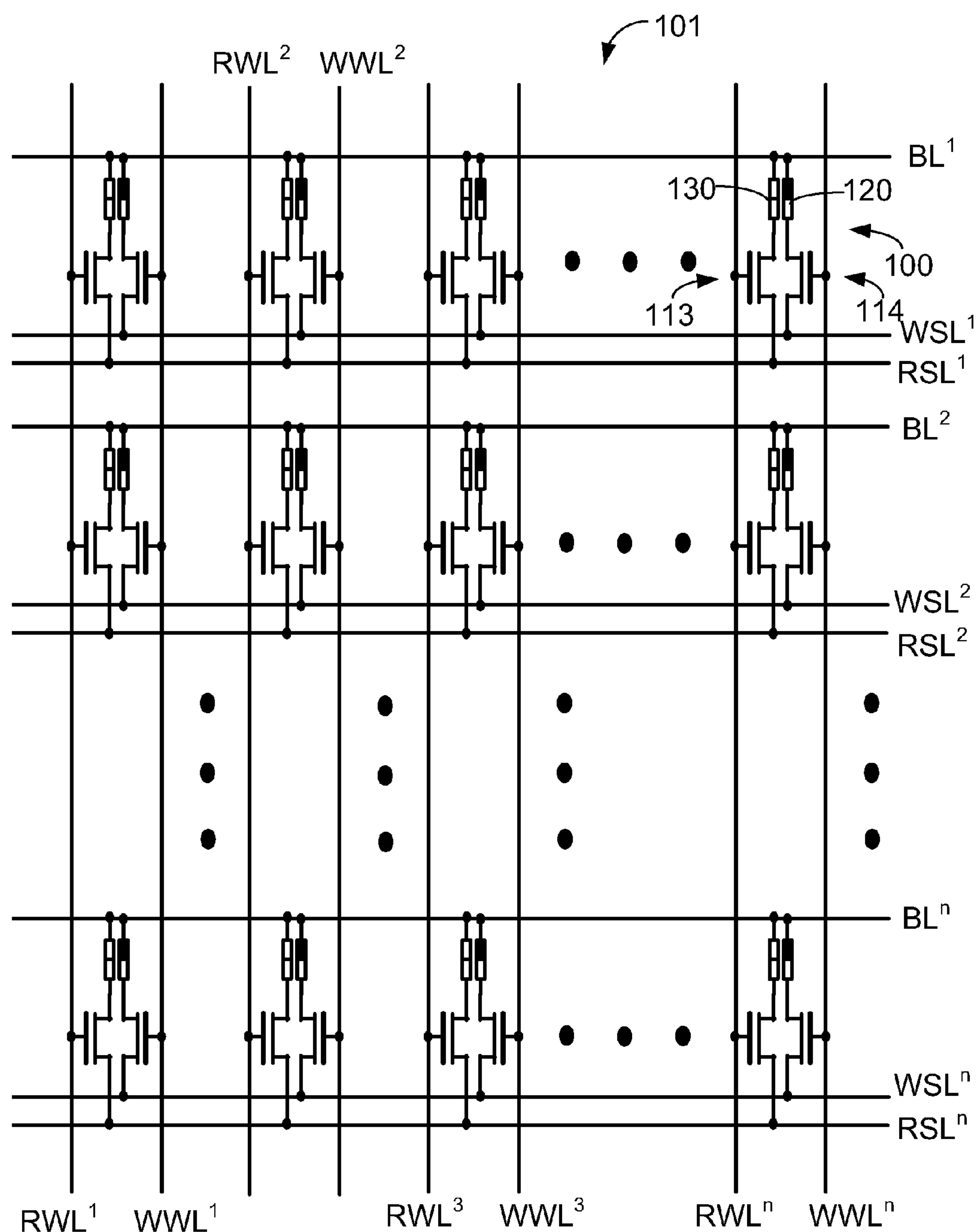
FIG. 6 is a schematic circuit diagram of an illustrative array of the memory units of FIG. 5, FIG. 7, FIG. 8, and FIG. 10.

FIG. 6 is a schematic circuit diagram of an illustrative array 101 of the memory units 100 of FIG. 5. The memory array 101 includes a plurality of memory units 100 described above and configured and arranged in a cross-point array where each cross-point includes a read and write bit line $BL^1$ $BL^2$ $BL''$, a read source line $RSL^1$ $RSL^2$ $RSL''$, a write source line $WSL^1$ $WSL^2$ $WSL''$, a write word line $WWL^1$ $WWL^2$ $WWL^3$ $WWL''$ and a read word line $RWL^1$ $RWL^2$ $RWL^3$ $RWL''$. For example, the labeled cross point memory unit 100 GMR cell 120 is electrically coupled to the $WSL^1$ via the write transistor 114 and the MTJ cell 130 is electrically coupled to is electrically coupled to the $RSL^1$ via the read transistor 113. The write transistor 114 is electrically coupled to the $WWL''$ and the read transistor 113 is electrically coupled to the $RWL''$. The giant magnetoresistance cell 120 is electrically coupled to the write bit line $BL^1$ and the write transistor 114. The magnetic tunnel junction data cell 130 is electrically coupled to the read bit line $BL^1$ and the read transistor 113.

Figure 7:
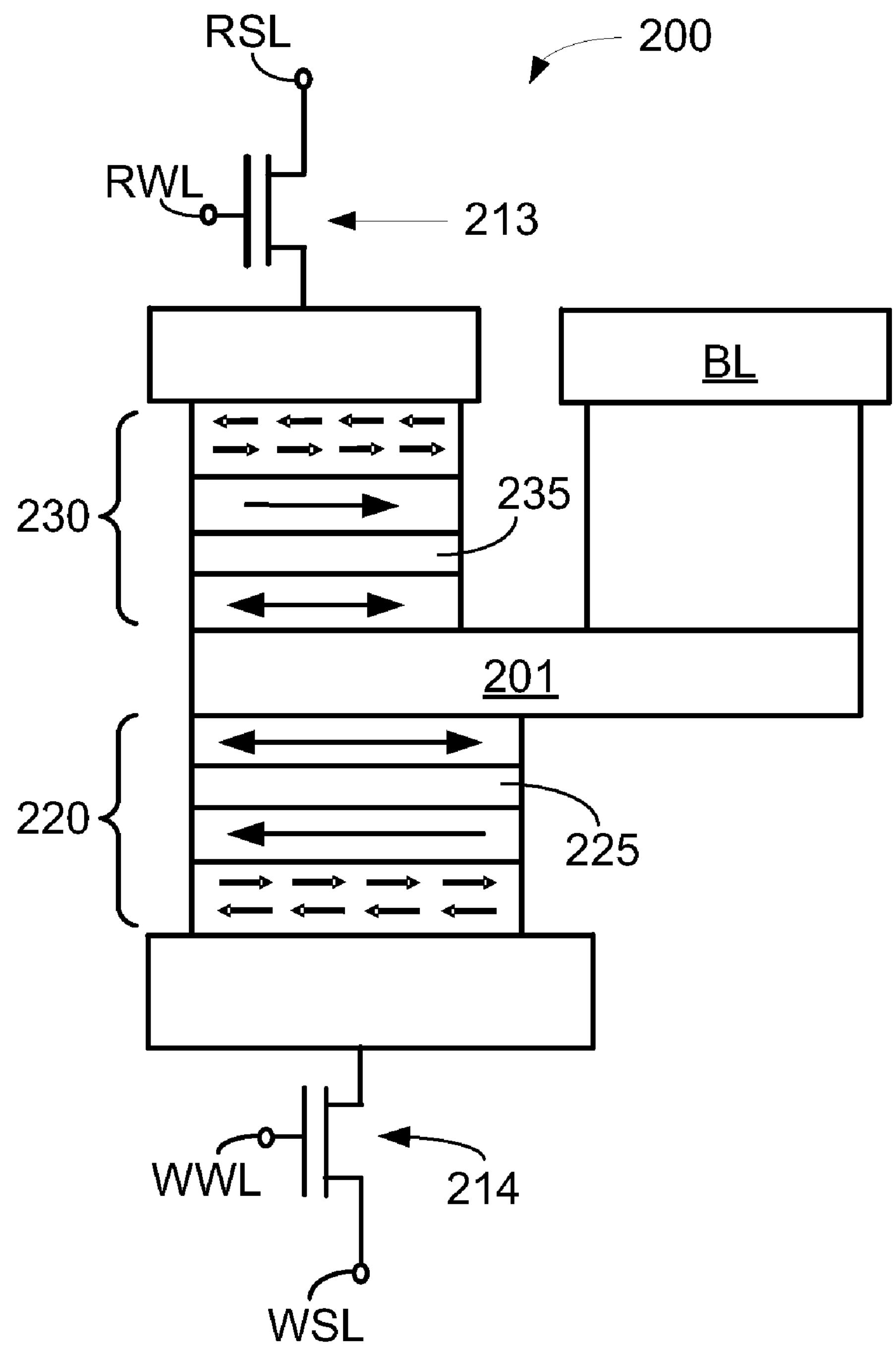
FIG. 7 is a cross-sectional schematic diagram of another illustrative memory unit.

FIG. 7 is a cross-sectional schematic diagram of another illustrative memory unit 200. The memory unit 200 includes a giant magnetoresistance cell 220 electrically coupled between a write bit line BL and a write source line WSL. A magnetic tunnel junction data cell 230 is electrically coupled between a read bit line BL and a read source line RSL. In the illustrated embodiment, the write bit line BL and the read bit line BL is a common bit line BL (or common electrode) and the write bit line BL and the read bit line BL are not separately addressable.

The giant magnetoresistance cell 220 and the magnetic tunnel junction data cell 230 can isolated from each other and adjacent each (sufficiently close to each other) other to allow for magnetostatic coupling (i.e., magnetic dipolar interaction) between the giant magnetoresistance cell 220 free layer and the magnetic tunnel junction data cell 230 free layer, as described above.

The giant magnetoresistance cell 220 includes a ferromagnetic free layer (double headed arrow layer) and a ferromagnetic reference (i.e., pinned) layer (single headed arrow layer) and a pinning layer (multiple single headed arrows layer). The ferromagnetic free layer and a ferromagnetic reference layer are separated by a non-magnetic electrically conducting layer 225, as described above. The magnetic tunnel junction data cell 230 includes a ferromagnetic free layer (double headed arrow layer) and a ferromagnetic reference (i.e., pinned) layer (single headed arrow layer) and a pinning layer (multiple single headed arrows layer). The ferromagnetic free layer and a ferromagnetic reference layer are separated by an oxide barrier layer 235 or tunnel barrier, as described above.

In the illustrated embodiment, a non-magnetic electrically conducting element 201 electrically couples the common bit line BL to the giant magnetoresistance cell 220 free layer and the magnetic tunnel junction data cell 230 free layer. The non-magnetic electrically conducting element 201 can also be described as a spacer layer, separating the giant magnetoresistance cell 220 free layer and the magnetic tunnel junction data cell 230 free layer by any useful distance that allows for magnetostatic coupling between the giant magnetoresistance cell 220 free layer and the magnetic tunnel junction data cell 230 free layer. In many embodiments, this distance is less than 100 nm or in a range from 10 to 80 nm, or in a range from 20 nm to 50 nm.

In the illustrated embodiment, the giant magnetoresistance cell 220 and the magnetic tunnel junction data cell 230 formed as separate stacks where the giant magnetoresistance cell 220 free layer and the magnetic tunnel junction data cell 230 free layer are adjacent to one another to allow for magnetostatic coupling. However, the pinned layers for both the giant magnetoresistance cell 220 and the magnetic tunnel junction data cell 230 are not adjacent to each other or co-planar, as illustrated. As illustrated, the giant magnetoresistance cell 220 free layer and the magnetic tunnel junction data cell 230 free layer a disposed between or separating the giant magnetoresistance cell 220 pinned layer and the magnetic tunnel junction data cell 230 pinned layer. This construction allows for formation of the giant magnetoresistance cell 220 and the magnetic tunnel junction data cell 230 separately as the layers of the memory unit 200 are formed. This can improve the manufacture of the memory unit 200.

A write transistor 214 is electrically couples a write source line WSL to the giant magnetoresistance cell 220. The write transistor 214 has a gate that is electrically coupled to a write word line WWL to activate the write transistor 214 and allow current to pass between the write source line WSL and the write bit line BL. The write transistor 214 can be any useful transistor, as described above.

A read transistor 213 electrically couples the read source line RSL to the magnetic tunnel junction data cell 230. The read transistor 213 has a gate that is electrically coupled to a read word line RWL to activate the read transistor 213 and allow current to pass between the read source line RSL and the read bit line BL. The read transistor 213 can be any useful transistor, as described above.

The giant magnetoresistance cell 220 and the magnetic tunnel junction data cell 230 are described above. In the illustrated embodiment, a pinning layer (multiple small single headed arrow layer) can be present to assist in pinning the pinned layer. The write current passes through the giant magnetoresistance cell 220 and alters the relative orientation of the magnetization vectors or magnetization orientations of the ferromagnetic layers (free and pinned layers), as described above. The read current resistance across the magnetic tunnel junction data cell 230 is determined by the relative orientation of the magnetization vectors or magnetization orientations of the ferromagnetic layers (free and pinned layers), as described above.

The magnetization direction of the ferromagnetic reference layer is pinned in a predetermined direction while the magnetization direction of the ferromagnetic free layer is free to rotate under the influence of magnetostatic coupling with the free layer of the giant magnetoresistance cell 220. The magnetic tunnel junction data cell 230 is configured to switch between a high resistance state and a low resistance state by magnetostatic coupling with the giant magnetoresistance cell. Pinning of the ferromagnetic reference layer may be achieved through, e.g., the use of exchange bias with an antiferromagnetically ordered material such as PtMn, IrMn and others.

The illustrative memory unit 200 may be used to construct a memory device that includes multiple memory units (as illustrated in FIG. 6, for example) where a data bit is stored in magnetic tunnel junction data cell by changing the relative magnetization state of the free magnetic layer with respect to the pinned magnetic layer by magnetostatic coupling with the free layer of the giant magnetoresistance cell. The stored data bit can be read out by measuring the resistance of the magnetic tunnel junction data cell. In order for the memory unit 200 to have the characteristics of a non-volatile memory, the free layers of the MTJ and GMR exhibit thermal stability against random fluctuations so that the orientation of the free layers are changed only when it is controlled to make such a change, as described above.

Figure 8:
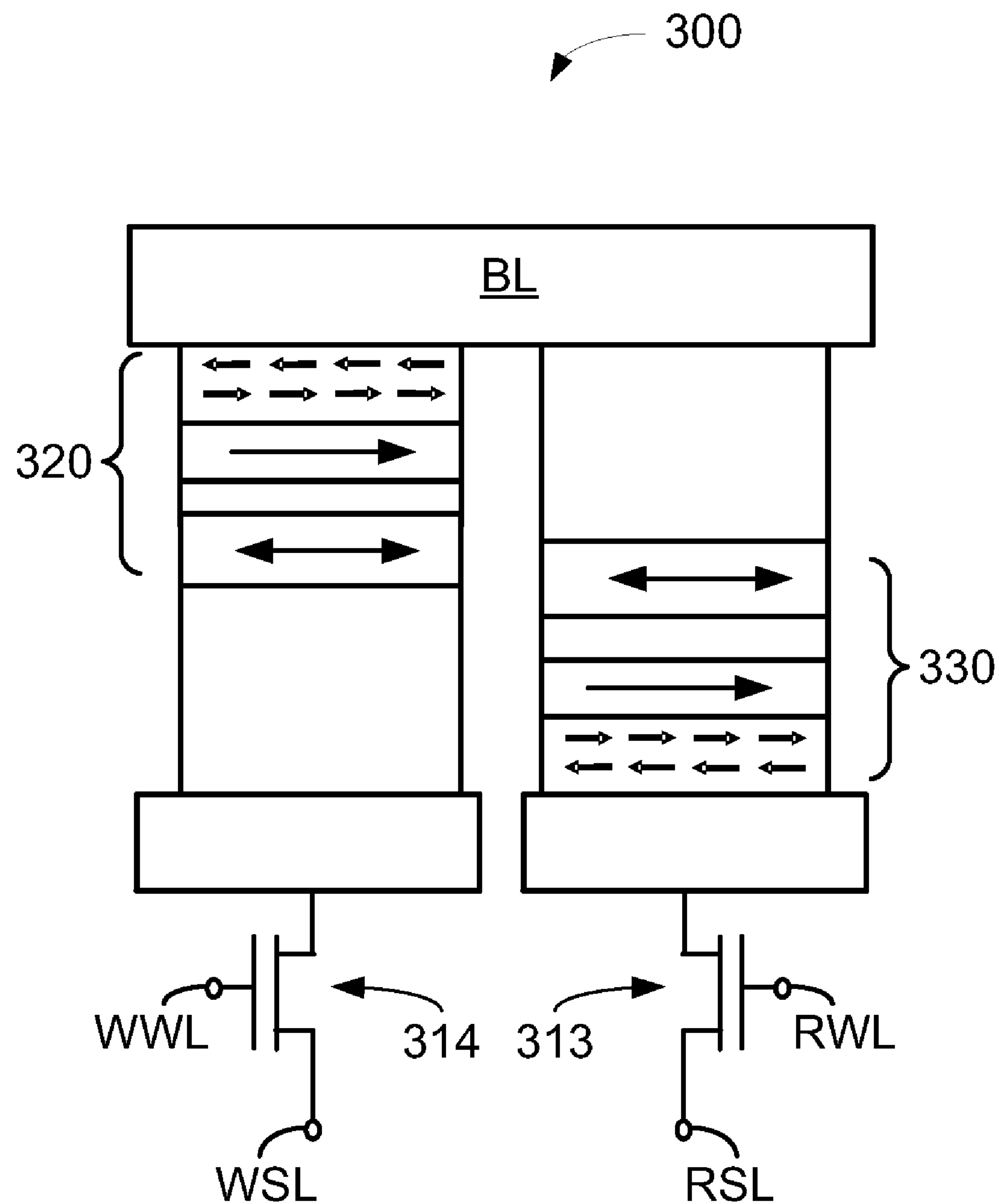
FIG. 8 is a cross-sectional schematic diagram of another illustrative memory unit.

FIG. 8 is a cross-sectional schematic diagram of another illustrative memory unit 300. The memory unit 300 includes a giant magnetoresistance cell 320 electrically coupled between a write bit line BL and a write source line WSL. A magnetic tunnel junction data cell 330 is electrically coupled between a read bit line BL and a read source line RSL. In the illustrated embodiment, the write bit line BL and the read bit line BL is a common bit line BL (or common electrode) and the write bit line BL and the read bit line BL are not separately addressable.

The giant magnetoresistance cell 320 and the magnetic tunnel junction data cell 330 can isolated from each other and adjacent each (sufficiently close to each other) other to allow for magnetostatic coupling (i.e., magnetic dipolar interaction) between the giant magnetoresistance cell 320 free layer and the magnetic tunnel junction data cell 330 free layer, as described above.

In the illustrated embodiment, the giant magnetoresistance cell 320 and the magnetic tunnel junction data cell 330 formed as separate stacks where the giant magnetoresistance cell 320 free layer and the magnetic tunnel junction data cell 330 free layer are adjacent to one another to allow for magnetostatic coupling. However, the pinned layers for both the giant magnetoresistance cell 320 and the magnetic tunnel junction data cell 330 are not adjacent to each other or coplanar, as illustrated. This construction allows for formation of the giant magnetoresistance cell 320 and the magnetic tunnel junction data cell 330 separately as the layers of the memory unit 300 are formed. This can improve the manufacture of the memory unit 300.

A write transistor 314 is electrically couples a write source line WSL to the giant magnetoresistance cell 320. The write transistor 314 has a gate that is electrically coupled to a write word line WWL to activate the write transistor 314 and allow current to pass between the write source line WSL and the write bit line BL. The write transistor 314 can be any useful transistor, as described above.

A read transistor 313 electrically couples the read source line RSL to the magnetic tunnel junction data cell 330. The read transistor 313 has a gate that is electrically coupled to a read word line RWL to activate the read transistor 313 and allow current to pass between the read source line RSL and the read bit line BL. The read transistor 313 can be any useful transistor, as described above.

The giant magnetoresistance cell 320 and the magnetic tunnel junction data cell 330 are described above. In the illustrated embodiment, a pinning layer (multiple small single headed arrow layer) can be present to assist in pinning the pinned layer. The write current passes through the giant magnetoresistance cell 320 and alters the relative orientation of the magnetization vectors or magnetization orientations of the ferromagnetic layers (free and pinned layers), as described above. The read current resistance across the magnetic tunnel junction data cell 330 is determined by the relative orientation of the magnetization vectors or magnetization orientations of the ferromagnetic layers (free and pinned layers), as described above.

The magnetization direction of the ferromagnetic reference layer is pinned in a predetermined direction while the magnetization direction of the ferromagnetic free layer is free to rotate under the influence of magnetostatic coupling with the free layer of the giant magnetoresistance cell 320. The magnetic tunnel junction data cell 330 is configured to switch between a high resistance state and a low resistance state by magnetostatic coupling with the giant magnetoresistance cell. Pinning of the ferromagnetic reference layer may be achieved through, e.g., the use of exchange bias with an antiferromagnetically ordered material such as PtMn, IrMn and others.

The illustrative memory unit 300 may be used to construct a memory device that includes multiple memory units (as illustrated in FIG. 6, for example) where a data bit is stored in magnetic tunnel junction data cell by changing the relative magnetization state of the free magnetic layer with respect to the pinned magnetic layer by magnetostatic coupling with the free layer of the giant magnetoresistance cell. The stored data bit can be read out by measuring the resistance of the magnetic tunnel junction data cell. In order for the memory unit 300 to have the characteristics of a non-volatile memory, the free layers of the MTJ and GMR exhibit thermal stability against random fluctuations so that the orientation of the free layers are changed only when it is controlled to make such a change, as described above.

FIG. 9 is a cross-sectional schematic diagram of another illustrative memory unit 400. The memory unit 400 includes a giant magnetoresistance cell 420 electrically coupled between a write bit line WBL and a write source line WSL. A magnetic tunnel junction data cell 430 is electrically coupled between a read bit line RBL and a read source line RSL. In the illustrated embodiment, the write bit line WBL and the read bit line RBL are separately addressable and the write source line WSL and the read source line RSL are separately addressable.

The giant magnetoresistance cell 420 and the magnetic tunnel junction data cell 430 can isolated from each other and spaced apart form one another a distance that does not allow for magnetostatic coupling (i.e., magnetic dipolar interaction) between the giant magnetoresistance cell 420 free layer and the magnetic tunnel junction data cell 430 free layer. In many embodiments, this distance is greater than 100 nm or greater than 150 nm or greater than 200 nm, depending on the relative magnetic field strength of the giant magnetoresistance cell 420 free layer and the relative size and coercively of the magnetic tunnel junction data cell 430 free layer.

The giant magnetoresistance cell 420 includes a ferromagnetic free layer (double headed arrow layer) and a ferromagnetic reference (i.e., pinned) layer (single headed arrow layer) and a pinning layer (multiple single headed arrows layer). The ferromagnetic free layer and a ferromagnetic reference layer are separated by a non-magnetic electrically conducting layer 425, as described above. The magnetic tunnel junction data cell 430 includes a ferromagnetic free layer (double headed arrow layer) and a ferromagnetic reference (i.e., pinned) layer (single headed arrow layer) and a pinning layer (multiple single headed arrows layer). The ferromagnetic free layer and a ferromagnetic reference layer are separated by an oxide barrier layer 435 or tunnel barrier, as described above.

In the illustrated embodiment, the giant magnetoresistance cell 420 and the magnetic tunnel junction data cell 430 formed as separate stacks where the giant magnetoresistance cell 420 free layer and the magnetic tunnel junction data cell 430 free layer are generally coplanar to allow a bridge 450 of magnetic dots (of any shape) to at least partially extend between the giant magnetoresistance cell 420 free layer and the magnetic tunnel junction data cell 430 free layer. In the illustrated embodiment, an electrically insulating material 451, 452 couples the bridge 450 of magnetic dots to the giant magnetoresistance cell 420 and the magnetic tunnel junction data cell 430, respectively. This electrically insulating material 451, 452 can be any useful electrically insulating material such as, for example, an oxide material. The electrically insulating material 451, 452 can be utilized to prevent or mitigate any current leakage across the bridge 450 of magnetic dots.

The bridge 450 of magnetic dots can utilize the phenomena known as magnetic quantum cellular automata. The magnetic dots can be single domain magnetic dots that couple to their nearest neighboring dot or free layer via magnetostatic coupling. The magnetic dots can be disposed on the bridge element 450 in any useful size or period. In one example, the magnetic dots had a diameter of about 100 nm and placed on a pitch of about 135 nm and having a thickness of about 10 nm. These magnetic dots can be formed from any useful magnetic material such as, for example, magnetic alloys (e.g., supermally $Ni_{80}Fe_{14}Mo_5X$ where X is other metals) and placed on a single-crystal silicon substrate bridge 450. The bridge 450 of magnetic dots provides magnetostatic coupling of the giant magnetoresistance cell 420 free layer and the magnetic tunnel junction data cell 430 free layer.

In the illustrated embodiment, the pinned layers for both the giant magnetoresistance cell 420 and the magnetic tunnel junction data cell 430 are not adjacent to each other or co-planar, as illustrated (however this is not required). This construction allows for formation of the giant magnetoresistance cell 420 and the magnetic tunnel junction data cell 430 separately as the layers of the memory unit 400 are formed. This can improve the manufacture of the memory unit 400.

A write transistor 414 is electrically couples a write source line WSL to the giant magnetoresistance cell 420. The write transistor 414 has a gate that is electrically coupled to a write word line WWL to activate the write transistor 414 and allow current to pass between the write source line WSL and the write bit line WBL. The write transistor 414 can be any useful transistor, as described above.

A read transistor 413 electrically couples the read source line RSL to the magnetic tunnel junction data cell 430. The read transistor 413 has a gate that is electrically coupled to a read word line RWL to activate the read transistor 413 and allow current to pass between the read source line RSL and the read bit line RBL. The read transistor 413 can be any useful transistor, as described above.

The giant magnetoresistance cell 420 and the magnetic tunnel junction data cell 430 are described above. In the illustrated embodiment, a pinning layer (multiple small single headed arrow layer) can be present to assist in pinning the pinned layer. The write current passes through the giant magnetoresistance cell 420 and alters the relative orientation of the magnetization vectors or magnetization orientations of the ferromagnetic layers (free and pinned layers), as described above. The read current resistance across the magnetic tunnel junction data cell 430 is determined by the relative orientation of the magnetization vectors or magnetization orientations of the ferromagnetic layers (free and pinned layers), as described above.

The magnetization direction of the ferromagnetic reference layer is pinned in a predetermined direction while the magnetization direction of the ferromagnetic free layer is free to rotate under the influence of magnetostatic coupling with the free layer of the giant magnetoresistance cell 420 via the bridge 450 of magnetic dots, described above. The magnetic tunnel junction data cell 430 is configured to switch between a high resistance state and a low resistance state by magnetostatic coupling with the giant magnetoresistance cell. Pinning of the ferromagnetic reference layer may be achieved through, e.g., the use of exchange bias with an antiferromagnetically ordered material such as PtMn, IrMn and others.

Figure 9A:
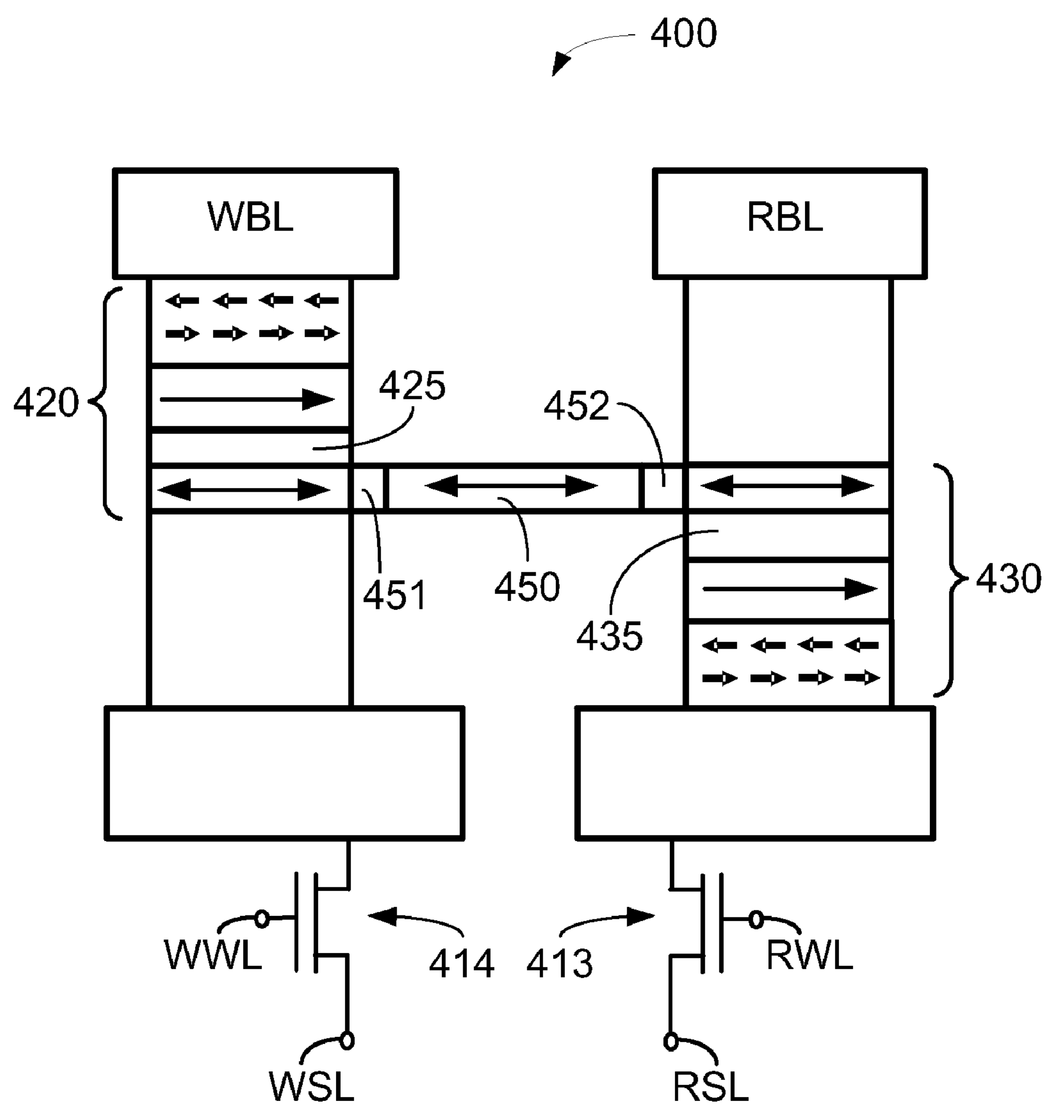
FIG. 9A is a cross-sectional schematic diagram of another illustrative memory unit.
Figure 9B:
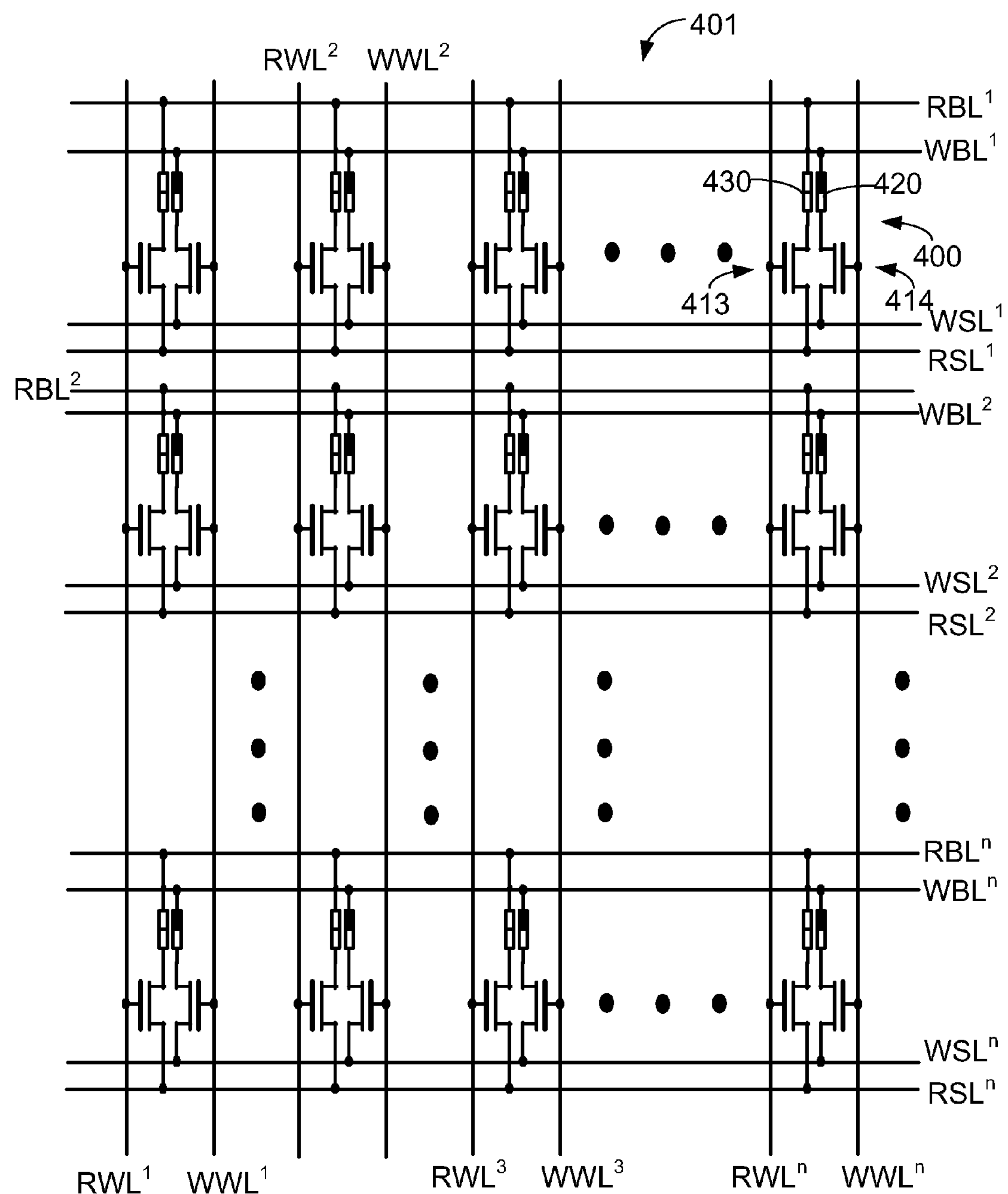
FIG. 9B is a schematic circuit diagram of an illustrative array of the memory units of FIG. 9A.

The illustrative memory unit 400 may be used to construct a memory device that includes multiple memory units (as illustrated in FIG. 9B, for example) where a data bit is stored in magnetic tunnel junction data cell by changing the relative magnetization state of the free magnetic layer with respect to the pinned magnetic layer by magnetostatic coupling with the free layer of the giant magnetoresistance cell via the bridge 450 of magnetic dots. The stored data bit can be read out by measuring the resistance of the magnetic tunnel junction data cell. In order for the memory unit 400 to have the characteristics of a non-volatile memory, the free layers of the MTJ and GMR exhibit thermal stability against random fluctuations so that the orientation of the free layers are changed only when it is controlled to make such a change, as described above.

FIG. 9B is a schematic circuit diagram of an illustrative array of the memory units of FIG. 9A. The memory array 401 includes a plurality of memory units 400 described above and configured and arranged in a cross-point array where each cross-point includes a read bit line $RBL^1$ $RBL^2$ $RBL''$ and write bit line $WBL^1$ $WBL^2$ $WBL''$, a read source line $RSL^1$ $RSL^2$ $RSL''$, a write source line $WSL^1$ $WSL^2$ $WSL''$, a write word line $WWL^1$ $WWL^2$ $WWL^3$ $WWL''$ and a read word line $RWL^1$ $RWL^2$ $RWL^3$ $RWL''$. For example, the labeled cross point memory unit 400 GMR cell 520 is electrically coupled to the $WSL^1$ via the write transistor 414 and the MTJ cell 430 is electrically coupled to is electrically coupled to the $RSL^1$ via the read transistor 413. The write transistor 414 is electrically coupled to the $WWL''$ and the read transistor 413 is electrically coupled to the $RWL''$. The giant magnetoresistance cell 420 is electrically coupled to the write bit line $WBL^1$ and the write transistor 114. The magnetic tunnel junction data cell 430 is electrically coupled to the read bit line $RBL^1$ and the read transistor 413.

Figure 10:
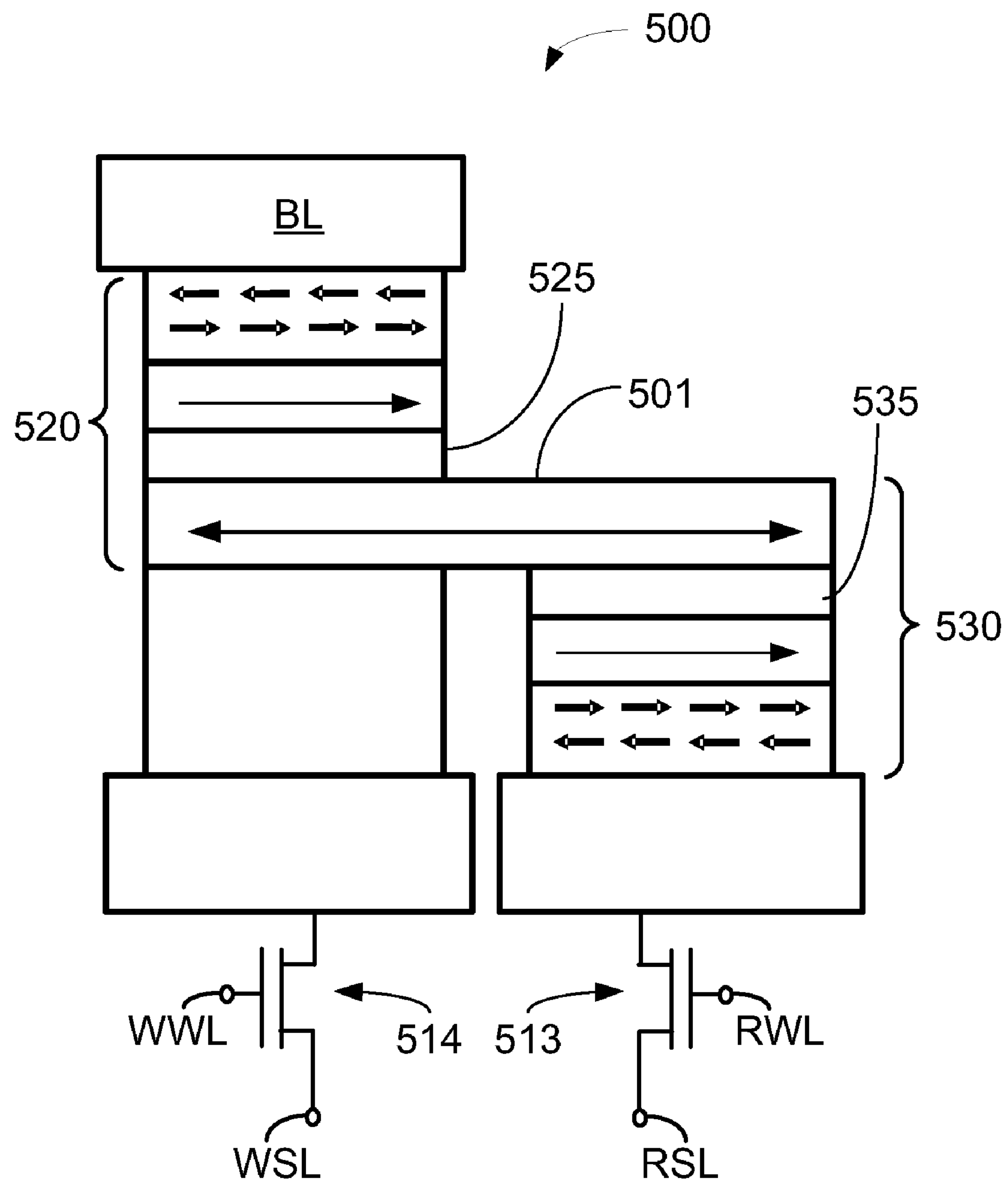
FIG. 10 is a cross-sectional schematic diagram of another illustrative memory unit.

FIG. 10 is a cross-sectional schematic diagram of another illustrative memory unit 500. The memory unit 500 includes a giant magnetoresistance cell 520 electrically coupled between a write bit line BL and a write source line WSL. A magnetic tunnel junction data cell 530 is electrically coupled between a read bit line BL and a read source line RSL. In the illustrated embodiment, the write bit line BL and the read bit line BL is a common bit line BL (or common electrode) and the write bit line BL and the read bit line BL are not separately addressable.

The giant magnetoresistance cell 520 includes a ferromagnetic free layer 501 (double headed arrow layer) and a ferromagnetic reference (i.e., pinned) layer (single headed arrow layer) and a pinning layer (multiple single headed arrows layer). The ferromagnetic free layer 501 and a ferromagnetic reference layer are separated by a non-magnetic electrically conducting layer 525, as described above. The magnetic tunnel junction data cell 530 includes the ferromagnetic free layer 501 (double headed arrow layer) and a ferromagnetic reference (i.e., pinned) layer (single headed arrow layer) and a pinning layer (multiple single headed arrows layer). The ferromagnetic free layer 501 and a ferromagnetic reference layer are separated by an oxide barrier layer 535 or tunnel barrier, as described above.

The giant magnetoresistance cell 520 and the magnetic tunnel junction data cell 530 are electrically coupled to one another and share a common free layer 501. In the illustrated embodiment, the giant magnetoresistance cell 520 and the magnetic tunnel junction data cell 530 formed as separate stacks where the giant magnetoresistance cell 520 free layer 501 and the magnetic tunnel junction data cell 230 free layer 501 are coextensive. The pinned layers for both the giant magnetoresistance cell 520 and the magnetic tunnel junction data cell 530 are not adjacent to each other or co-planar, as illustrated. As illustrated, the giant magnetoresistance cell 520 free layer 501 and the magnetic tunnel junction data cell 530 free layer 501 separates the giant magnetoresistance cell 520 non-magnetic electrically conducting layer 525 (described above) and the magnetic tunnel junction data cell 530 oxide barrier layer 535 (described above). This construction allows for formation of the giant magnetoresistance cell 520 and the magnetic tunnel junction data cell 530 separately as the layers of the memory unit 500 are formed. This can improve the manufacture of the memory unit 500.

A write transistor 514 is electrically couples a write source line WSL to the giant magnetoresistance cell 520. The write transistor 514 has a gate that is electrically coupled to a write word line WWL to activate the write transistor 514 and allow current to pass between the write source line WSL and the write bit line BL. The write transistor 514 can be any useful transistor, as described above.

A read transistor 513 electrically couples the read source line RSL to the magnetic tunnel junction data cell 530. The read transistor 513 has a gate that is electrically coupled to a read word line RWL to activate the read transistor 513 and allow current to pass between the read source line RSL and the read bit line BL. The read transistor 513 can be any useful transistor, as described above.

The giant magnetoresistance cell 520 and the magnetic tunnel junction data cell 530 are described above. In the illustrated embodiment, a pinning layer (multiple small arrow layer) can be present to assist in pinning the pinned layer. The write current passes through the giant magnetoresistance cell 520 and alters the relative orientation of the magnetization vectors or magnetization orientations of the ferromagnetic layers (free and pinned layers), as described above. The read current resistance across the magnetic tunnel junction data cell 530 is determined by the relative orientation of the magnetization vectors or magnetization orientations of the ferromagnetic layers (free and pinned layers), as described above.

The magnetization direction of the ferromagnetic reference layer is pinned in a predetermined direction while the magnetization direction of the ferromagnetic free layer 501 is free to rotate under the influence of the write current. The free layer 501 is configured to switch between a high resistance state and a low resistance state upon application of the desired write current. Pinning of the ferromagnetic reference layer may be achieved through, e.g., the use of exchange bias with an antiferromagnetically ordered material such as PtMn, IrMn and others.

The illustrative memory unit 500 may be used to construct a memory device that includes multiple memory units (as illustrated in FIG. 6, for example) where a data bit is stored in magnetic tunnel junction data cell by changing the relative magnetization state of the free magnetic layer 501 with respect to the pinned magnetic layer. The stored data bit can be read out by measuring the resistance of the magnetic tunnel junction data cell. In order for the memory unit 500 to have the characteristics of a non-volatile memory, the free layer 501 exhibits thermal stability against random fluctuations so that the orientation of the free layers are changed only when it is controlled to make such a change, as described above.

Figure 11:
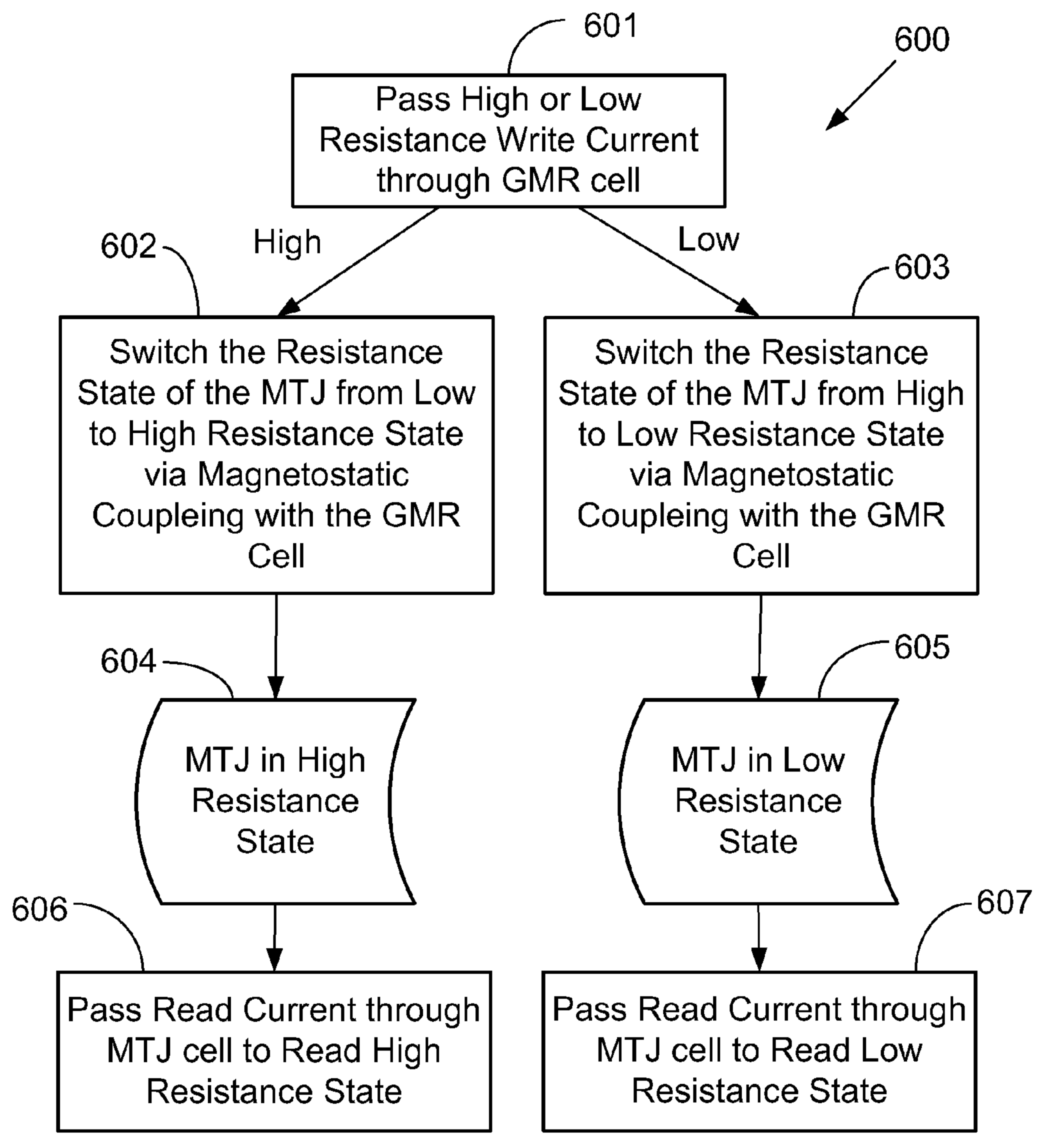
FIG. 11 is a flow diagram of an illustrative method for switching a resistance state of an illustrative magnetic tunnel junction memory cell.

FIG. 11 is a flow diagram of an illustrative method 600 for switching a resistance state of an illustrative magnetic tunnel junction memory cell. The initial step 601 is to pass a high or low resistance write current through the GMR cell. During this operation the MTJ cell is floating to avoid current from passing through the MTJ cell. Passing a high resistance state current through the GMR cell sets the magnetization orientation of the GMR cell free layer and via magnetostatic coupling, the free layer of the MTJ cell switches to a high resistance state at step 602. Passing a low resistance state current through the GMR cell sets the magnetization orientation of the GMR cell free layer and via magnetostatic coupling, the free layer of the MTJ cell switches to a low resistance state at step 603. Then the MTJ cell is either in the low resistance data state 604 or the high resistance data state 605. A read current can pass through the MTJ cell to read a high resistance state at step 606 or a low resistance state at step 607. During the read operation the GMR cell is floating to avoid current from passing through the MTJ cell.

In many of the embodiments described herein, the MTJ cell can be made smaller than the GMR cell so that the MTJ cell can be easily written to. In many of these embodiments, the giant magnetoresistance cell has a first free magnetic layer volume and the magnetic tunnel junction data cell has a second free magnetic layer volume, and the second free magnetic layer volume is less than the first free magnetic layer volume. In some embodiments, the second free layer volume is 90% or less the first free layer volume, or 80% or less or 70% or less, as desired.

Thus, embodiments of the MEMORY WITH SEPARATE READ AND WRITE PATHS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory unit comprising:

a giant magnetoresistance cell electrically coupled between a write bit line and a write source line, a write current passing through the giant magnetoresistance cell switches the giant magnetoresistance cell between a high resistance state and a low resistance state, the giant magnetoresistance cell comprises a free magnetic layer separated from a first pinned magnetic layer by a first non-magnetic electrically conducting layer; and a magnetic tunnel junction data cell electrically coupled between a read bit line and a read source line, the magnetic tunnel junction data cell is configured to switch between a high resistance state and a low resistance state by magnetostatic coupling with the giant magnetoresistance cell, and be read by a read current passing though the magnetic tunnel junction data cell, the magnetic tunnel junction data cell comprises the free magnetic layer separated from a second pinned magnetic layer by an oxide barrier layer, wherein the free magnetic layer of the magnetic tunnel junction data cell is coextensive with the free magnetic layer of the giant magnetoresistance cell and the pinned magnetic layer of the magnetic tunnel junction data cell is not adjacent to the pinned magnetic layer of the giant magnetoresistance cell.

2. A memory unit according to claim 1, wherein the write bit line and the read bit line is a common bit line and the write source line is separately addressable from the read source line.

3. A memory unit according to claim 1, wherein the read bit line and the write bit line is a common bit line and the read source line is separately addressable from the write source line and a write transistor is electrically coupled between the write source line and the giant magnetoresistance cell, and a read transistor is electrically coupled between the read source line and the magnetic tunnel junction data cell.

4. A memory unit according to claim 1, wherein the read bit line and the write bit line are separately addressable and the read source line is separately addressable from the write source line.

5. A memory unit according to claim 1, wherein the giant magnetoresistance cell is spaced apart from the magnetic tunnel junction data cell a distance sufficient to prevent magnetostatic coupling between the giant magnetoresistance cell and the magnetic tunnel junction data cell, and the memory unit further comprises bridge of magnetic dots at least partially extending between the giant magnetoresistance cell and the magnetic tunnel junction data cell that provides magnetostatic coupling between the giant magnetoresistance cell and the magnetic tunnel junction data cell.

6. A memory unit according to claim 1, wherein the giant magnetoresistance cell is electrically connected to a write transistor and the write transistor is electrically connected to a write word line, and the magnetic tunnel junction data cell is electrically connected to a read transistor and the read transistor is electrically connected to a read word line.

7. A memory array comprising two or more memory units according to claim 1 arranged and configured in an array.

8. A memory unit comprising:

a giant magnetoresistance cell electrically coupled between a write bit line and a write source line, a write current passing through the giant magnetoresistance cell switches the giant magnetoresistance cell between a high resistance state and a low resistance state, the giant magnetoresistance cell comprises a free magnetic layer separated from a pinned magnetic layer by a non-magnetic electrically conducting layer; and a magnetic tunnel junction data cell electrically coupled between a read bit line and a read source line, the magnetic tunnel junction data cell is configured to switch between a high resistance state and a low resistance state, and be read by a read current passing though the magnetic tunnel junction data cell, and the magnetic tunnel junction data cell comprises a free magnetic layer separated from a pinned magnetic layer by an oxide barrier layer, and the free magnetic layer of the magnetic tunnel junction data cell is coextensive with the free magnetic layer of the giant magnetoresistance cell.

9. A memory unit according to claim 8, wherein the write bit line and the read bit line is a common bit line and the write source line is separately addressable from the read source line.

10. A memory unit according to claim 8, wherein the read bit line and the write bit line are separately addressable and the read source line is separately addressable from the write source line.

11. A memory unit according to claim 8, wherein the giant magnetoresistance cell is spaced apart from the magnetic tunnel junction data cell a distance sufficient to prevent magnetostatic coupling between the giant magnetoresistance cell and the magnetic tunnel junction data cell, and the memory unit further comprises bridge of magnetic dots at least partially extending between the giant magnetoresistance cell and the magnetic tunnel junction data cell that provides magnetostatic coupling between the giant magnetoresistance cell and the magnetic tunnel junction data cell.

12. A memory unit according to claim 8, wherein the giant magnetoresistance cell is electrically connected to a write transistor and the write transistor is electrically connected to a write word line, and the magnetic tunnel junction data cell is electrically connected to a read transistor and the read transistor is electrically connected to a read word line.

13. A memory unit according to claim 8, wherein the pinned magnetic layer of the magnetic tunnel junction data cell is not adjacent to the pinned magnetic layer of the giant magnetoresistance cell.

14. A memory unit according to claim 8, wherein the giant magnetoresistance cell is electrically connected to a write transistor and the write transistor is electrically connected to a write word line, and the magnetic tunnel junction data cell is electrically connected to a read transistor and the read transistor is electrically connected to a read word line.

15. A memory unit according to claim 8, wherein the free magnetic layer of the magnetic tunnel junction data cell is the free magnetic layer of the giant magnetoresistance cell, and the pinned magnetic layer of the magnetic tunnel junction data cell is not adjacent to the pinned magnetic layer of the giant magnetoresistance cell.

16. A memory array comprising two or more memory units according to claim 8 arranged and configured in an array.

17. A method comprising:

passing a write current thorough a giant magnetoresistance cell to switch a free magnetic layer that is coextensive to both the giant magnetoresistance cell and a magnetic tunnel junction data cell, between a high resistance state and a low resistance state; and reading the resistance state of the magnetic tunnel junction data cell by passing a reading current through the magnetic tunnel junction data cell, wherein the write current has a write current path and the read current has a read current path and the write current path is different than the read current path.

18. A method according to claim 17, wherein the write current does not pass through the magnetic tunnel junction data cell and the read current does not pass through the giant magnetoresistance cell.

* * * * *